(12) United States Patent
Shin et al.

(10) Patent No.: US 9,793,291 B2
(45) Date of Patent: Oct. 17, 2017

(54) METHOD OF MANUFACTURING A SEMICONDUCTOR DEVICE

(71) Applicant: SAMSUNG ELECTRONICS CO., LTD., Suwon-si, Gyeonggi-do (KR)

(72) Inventors: Hyun-Jin Shin, Seoul (KR); Hong-Suk Kim, Yongin-si (KR); Jung-Hwan Kim, Seoul (KR); Sang-Hoon Lee, Seongnam-si (KR); Hun-Hyeong Lim, Hwaseong-si (KR); Yong-Seok Cho, Yongin-si (KR); Young-Dae Kim, Yongin-si (KR); Han-Vit Yang, Suwon-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/142,365

(22) Filed: Apr. 29, 2016

(65) Prior Publication Data
US 2016/0343729 A1     Nov. 24, 2016

(30) Foreign Application Priority Data

May 21, 2015 (KR) .................. 10-2015-0071065

(51) Int. Cl.
| H01L 21/336 | (2006.01) |
| H01L 27/11582 | (2017.01) |
| H01L 21/3105 | (2006.01) |
| H01L 21/311 | (2006.01) |
| H01L 21/02 | (2006.01) |
| H01L 21/28 | (2006.01) |
| H01L 27/11521 | (2017.01) |
| H01L 27/11568 | (2017.01) |
| H01L 21/768 | (2006.01) |

(52) U.S. Cl.
CPC .... *H01L 27/11582* (2013.01); *H01L 21/0206* (2013.01); *H01L 21/28273* (2013.01); *H01L 21/28282* (2013.01); *H01L 21/3105* (2013.01); *H01L 21/31111* (2013.01); *H01L 21/76826* (2013.01); *H01L 21/76831* (2013.01); *H01L 27/11521* (2013.01); *H01L 27/11568* (2013.01)

(58) Field of Classification Search
None
See application file for complete search history.

(56) References Cited

U.S. PATENT DOCUMENTS

| 8,343,820 B2 | 1/2013 | Jung |
| 2009/0163010 A1 | 6/2009 | Oh et al. |
| 2009/0325369 A1 | 12/2009 | Kim et al. |

(Continued)

FOREIGN PATENT DOCUMENTS

| KR | 10-2006-0070061 A | 6/2006 |
| KR | 10-2009-0068464 A | 6/2009 |
| KR | 10-2010-0062698 A | 6/2010 |

*Primary Examiner* — Calvin Choi
(74) *Attorney, Agent, or Firm* — Lee & Morse, P.C.

(57) ABSTRACT

A method of manufacturing a semiconductor device, the method including forming a structure on a substrate, the structure including a metal pattern, at least a portion of the metal pattern being exposed; forming a preliminary buffer oxide layer to cover the structure, a metal oxide layer being formed at the exposed portion of the metal pattern; and deoxidizing the metal oxide layer so that the preliminary buffer oxide layer is transformed into a buffer oxide layer.

20 Claims, 24 Drawing Sheets

(56) References Cited

U.S. PATENT DOCUMENTS

| | | |
|---|---|---|
| 2012/0100708 A1 | 4/2012 | Park et al. |
| 2013/0075809 A1* | 3/2013 | Hsieh ................ H01L 29/66106 |
| | | 257/328 |
| 2013/0280878 A1* | 10/2013 | Wen .................... H01L 21/3105 |
| | | 438/299 |
| 2014/0213062 A1 | 7/2014 | Shimizu et al. |
| 2014/0273462 A1 | 9/2014 | Simsek-Ege et al. |
| 2014/0322885 A1 | 10/2014 | Xie et al. |
| 2015/0060953 A1* | 3/2015 | Kunath ................ G01N 27/414 |
| | | 257/253 |

* cited by examiner

FIRST
DIRECTION SECOND
⊗ DIRECTION

FIRST
DIRECTION
⊗ → SECOND
DIRECTION

METHOD OF MANUFACTURING A SEMICONDUCTOR DEVICE

CROSS-REFERENCE TO RELATED APPLICATION

Korean Patent Application No. 10-2015-0071065, filed on May 21, 2015, in the Korean Intellectual Property Office, and entitled: "Method of Manufacturing A Semiconductor Device," is incorporated by reference herein in its entirety.

BACKGROUND

1. Field

Example embodiments relate to a method of manufacturing a semiconductor device.

2. Description of the Related Art

A semiconductor device may include a conductive structure including a metal, and the semiconductor device may have defects due to, for example, contamination of the metal in the conductive structure or an increase of resistance of the conductive structure.

SUMMARY

Embodiments may be realized by providing a method of manufacturing a semiconductor device, the method including forming a structure on a substrate, the structure including a metal pattern, at least a portion of the metal pattern being exposed; forming a preliminary buffer oxide layer to cover the structure, a metal oxide layer being formed at the exposed portion of the metal pattern; and deoxidizing the metal oxide layer so that the preliminary buffer oxide layer is transformed into a buffer oxide layer.

Deoxidizing the metal oxide may include performing a plasma treatment on the structure.

The plasma treatment may be performed using an inert gas or a mixture of an inert gas and hydrogen gas.

The plasma treatment may be performed at a temperature of about 300° C. to about 600° C.

The method may further include, after deoxidizing the metal oxide layer, anisotropically etching the buffer oxide layer to form a buffer oxide pattern covering at least the metal pattern.

The method may further include, after forming the buffer oxide pattern, wet cleaning a surface of the buffer oxide pattern.

The method may further include, after forming the buffer oxide pattern, performing a plasma treatment on the buffer oxide pattern.

Forming the structure may include alternately and repeatedly forming insulating interlayers and sacrificial layers on the substrate; forming a plurality of channel structures through the insulating interlayers and sacrificial layers; etching the insulating interlayers and sacrificial layers between the channel structures to form an opening exposing an upper surface of the substrate; and replacing the sacrificial layers exposed by the opening with a metal pattern.

The preliminary buffer oxide layer may be conformally formed on a surface of the structure and the exposed upper surface of the substrate.

The method may further include, after forming the buffer oxide layer, forming a common source line to fill the opening.

The structure may include a tunnel insulation pattern, a charge storage pattern, a dielectric pattern, and the metal pattern sequentially stacked, the metal pattern serving as a control gate.

Forming the structure may include forming metal patterns and a first insulating interlayer on the substrate, the first insulating interlayer filling a gap between the metal patterns; and forming a second insulating interlayer on the first insulating interlayer, the second insulating interlayer including openings therethrough, an upper portion of each of the metal patterns being exposed by each of the openings.

Embodiments may be realized by providing a method of manufacturing a semiconductor device, the method including alternately and repeatedly forming insulating interlayers and sacrificial layers on a substrate; forming a plurality of channel structures through the insulating interlayers and sacrificial layers; etching the insulating interlayers and sacrificial layers between the channel structures to form an opening exposing an upper surface of the substrate; replacing the sacrificial layers exposed by the opening with gate lines, respectively, to form a structure, each of the gate lines including a metal; forming a preliminary buffer oxide layer on a sidewall and a top surface of the structure and the upper surface of the substrate exposed by the opening; performing a plasma treatment on the preliminary buffer oxide layer to form a buffer oxide layer; and partially etching the buffer oxide layer to form a buffer oxide pattern covering a least each of the gate lines.

The plasma treatment may be performed using an inert gas or a mixture of an inert gas and hydrogen gas.

The method may further include, after forming the buffer oxide pattern, wet cleaning a surface of the buffer oxide pattern.

The buffer oxide layer may be anisotropically etched.

Embodiments may be realized by providing a method of manufacturing a semiconductor device, the method including forming a plurality of pad patterns and a first insulating interlayer filling a gap between the pad patterns on a substrate; forming a second insulating interlayer on the first insulating interlayer, the second insulating interlayer including an opening exposing a portion of a surface of the pad pattern; forming a preliminary buffer oxide layer on a top surface of the second insulating interlayer, a sidewall of the opening, and the a surface of the pad pattern exposed by the opening; performing a plasma treatment on the preliminary buffer oxide layer to transform a portion of the preliminary buffer oxide layer into a buffer oxide layer; etching the buffer oxide layer to form a buffer oxide pattern exposing the pad pattern; and wet cleaning the buffer oxide pattern to remove the preliminary buffer oxide.

The plasma treatment may be performed using an inert gas or a mixture of an inert gas and hydrogen gas.

The plasma treatment may be performed so that a first portion of the preliminary buffer oxide layer is transformed into a buffer oxide layer and a second portion of the preliminary buffer oxide layer remains, the first portion of the preliminary buffer oxide layer may be higher than a top surface the pad pattern, and the second portion of the preliminary buffer oxide layer may be lower than a top surface the pad pattern.

The buffer oxide layer may be anisotropically etched, and the buffer oxide pattern may be formed on a sidewall of the opening.

Embodiments may be realized by providing a method of manufacturing of a semiconductor device, the method including forming a metal oxide on a surface of a metal pattern and a preliminary buffer oxide layer capping the metal pattern; and deoxidizing the metal oxide to remove the metal oxide, including increasing a density of the preliminary buffer oxide layer, and lowering a resistance of the metal pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
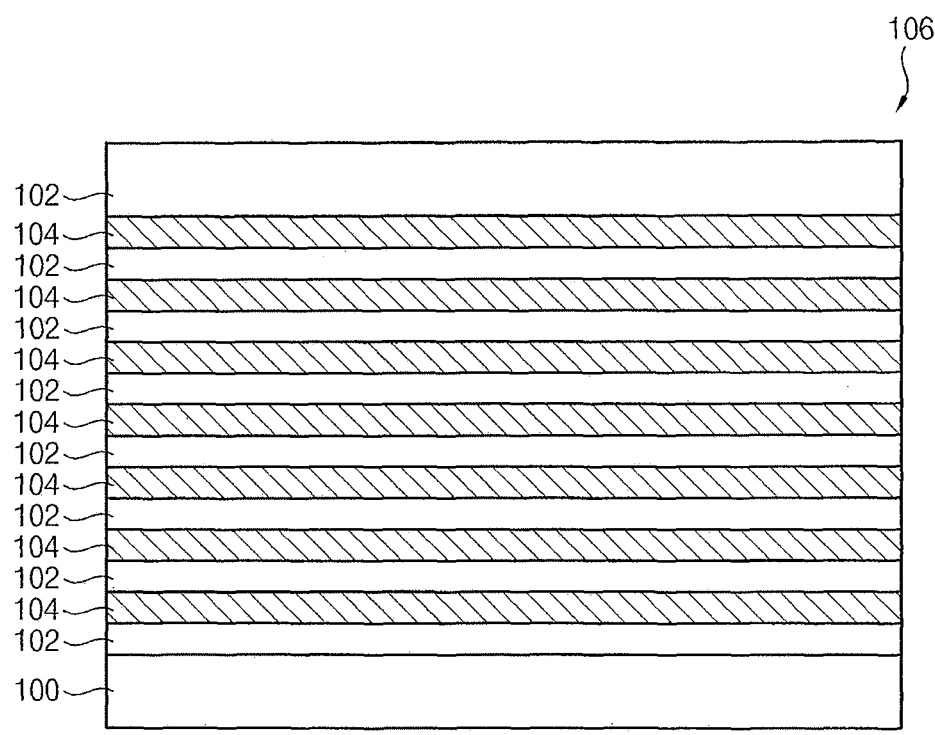
FIGS. 1 to 12 illustrate cross-sectional views of stages of a method of manufacturing a semiconductor device in accordance with example embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, the sizes and relative sizes of layers and regions may be exaggerated for clarity. It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to be limiting.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 12 illustrate cross-sectional views of stages of a method of manufacturing a semiconductor device in accordance with example embodiments.

Figure 7:
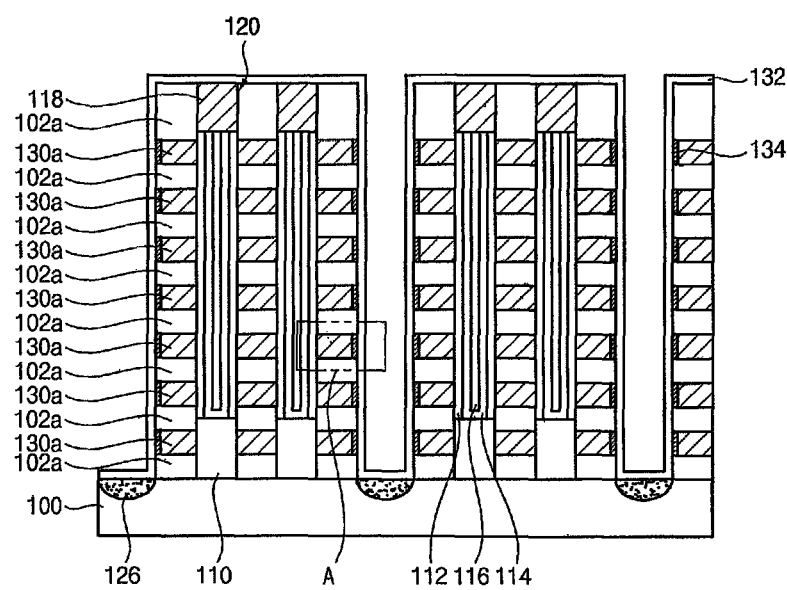
Figure 8:
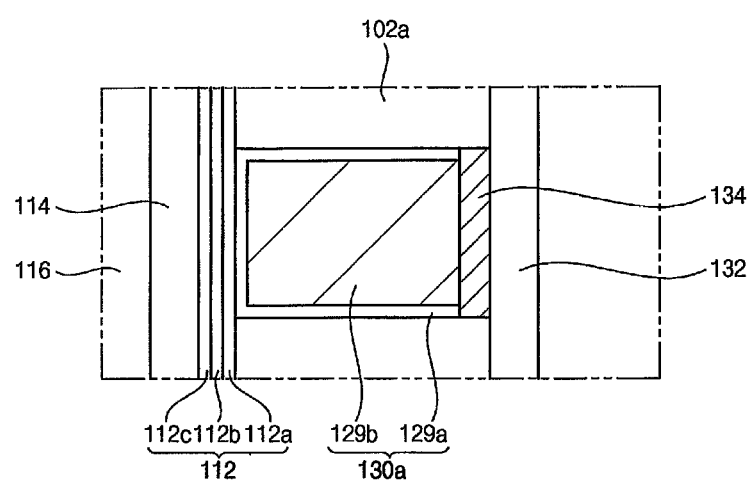
Figure 9:
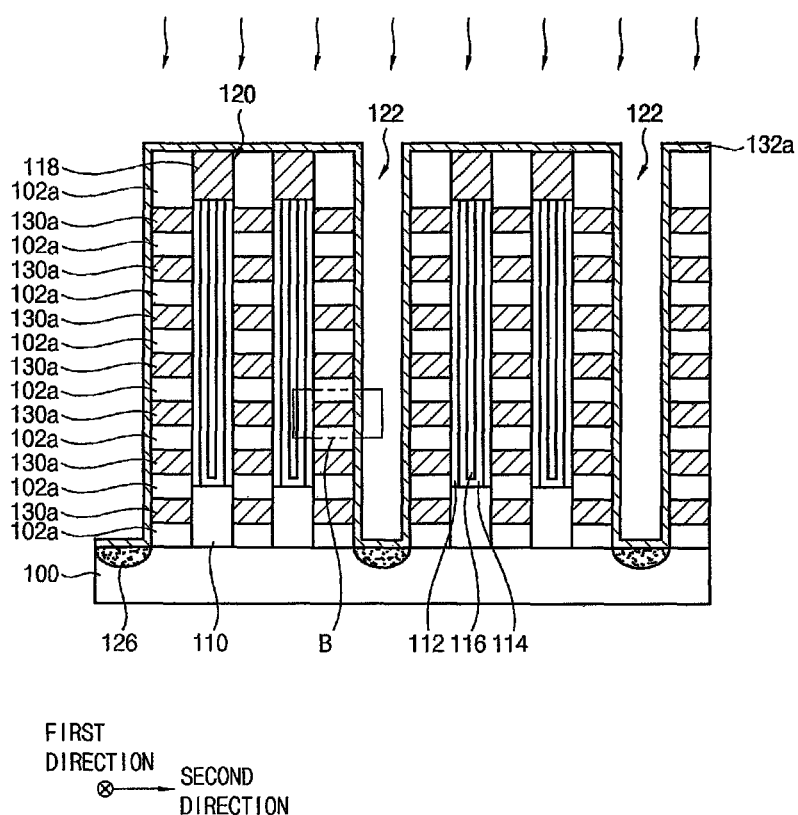
Figure 10:
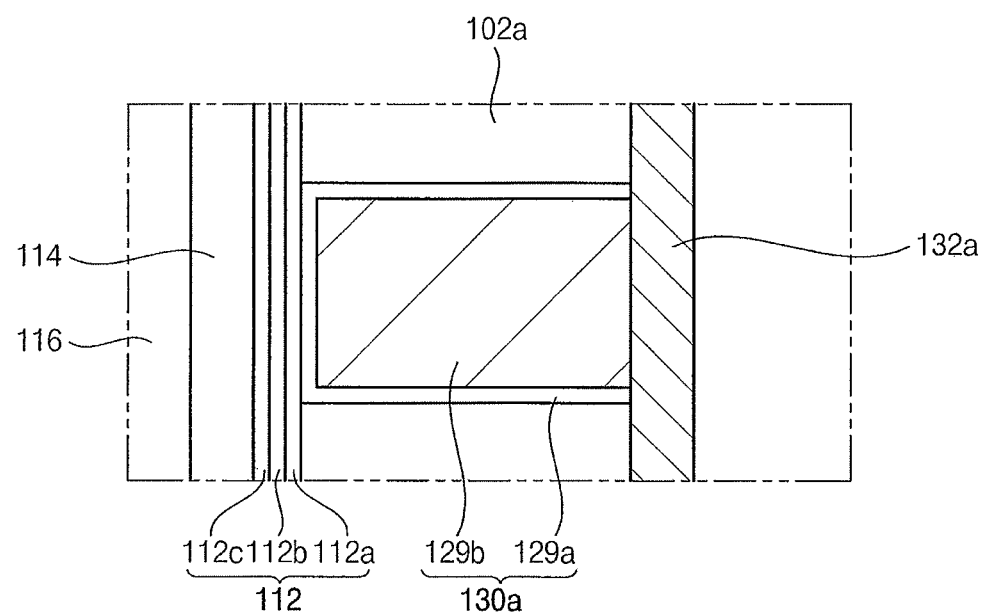

FIG. 8 illustrates an enlarged view of a portion "A" of FIG. 7, and FIG. 10 illustrates an enlarged view of a portion "B" of FIG. 9.

In example embodiments, the semiconductor device may be a vertical non-volatile memory device. In the vertical non-volatile memory device, memory cells may be formed on a channel extending in a vertical direction from an upper surface of a substrate.

Referring to FIG. 1, insulating interlayers 102 and sacrificial layers 104 may be alternately and repeatedly formed on a substrate 100, and a mold structure 106 including the insulating interlayers 102 and the sacrificial layers 104 may be formed.

In example embodiments, the insulating interlayers 102 may be formed of, e.g., silicon oxide, SiOC, or SiOF. The sacrificial layers 104 may be formed of a material having an etching selectivity with respect to the insulating interlayers 102. The sacrificial layers 104 may be formed of a material that may be easily removed by a wet etching process. The sacrificial layers 104 may be formed of a nitride, e.g., silicon nitride or SiBN.

The sacrificial layers 104 may be removed by a subsequent process to form gaps 124 (refer to FIG. 4), which may provide spaces for forming gate lines 130a (refer to FIG. 6), and the number of the insulating interlayers 102 and the sacrificial layers 104 may be determined according to the number of the gate lines 130a subsequently formed.

Figure 2:
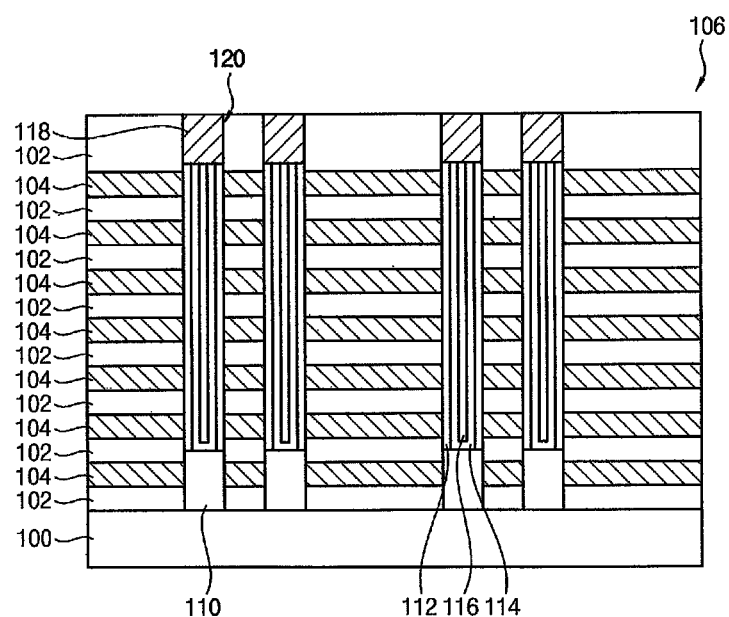

Referring to FIG. 2, a plurality of channel structures 120 may be formed through the mold structure 106.

In example embodiments, a hard mask may be formed on an uppermost one of the insulating interlayers 102, and the mold structure 106 may be anisotropically etched using the hard mask as an etching mask to form channel holes exposing upper surfaces of the substrate 100.

A selective epitaxial growth (SEG) process may be performed using the upper surfaces of the substrate 100 exposed by the channel holes as a seed to form a semiconductor pattern 110 filling a lower portion of each the channel holes. In some example embodiments, the semiconductor pattern 110 may not be formed in each of the channel holes.

A preliminary dielectric structure may be formed on a bottom and a sidewall of each of the channel holes and a top surface of the mold structure 106. In example embodiments, the preliminary dielectric structure may include a blocking layer, a charge storage layer and a tunnel insulation layer substantially stacked. The blocking layer may be formed of an oxide, e.g., silicon oxide or a metal oxide, the charge storage layer may be formed of a nitride, e.g., silicon nitride, and the tunnel insulation layer may be formed of an oxide, e.g., silicon oxide. In example embodiments, the preliminary dielectric structure may be formed to have an ONO structure including an oxide layer, a nitride layer and an oxide layer sequentially stacked.

Each of the blocking layer, the charge storage layer and the tunnel insulation layer may be formed by a chemical vapor deposition (CVD) process, a plasma enhanced chemical vapor deposition (PE-CVD) process, or an atomic layer deposition (ALD) process.

The preliminary dielectric structure on the bottom of each of the channel holes may be etched by an etch back process to expose a top surface of the semiconductor pattern 110, and a dielectric structure 112 including a blocking pattern 112a (refer to FIG. 8), a charge storage pattern 112b (refer to FIG. 8), and a tunnel insulation pattern 112c (refer to FIG. 8) may be formed on the sidewall of each of the channel holes to have a cylindrical shape.

A channel layer 114 may be conformally formed on the insulating interlayer 102, the dielectric structure 112, and the exposed top surface of the semiconductor pattern 110, and a filling pattern 116 may be formed on the channel layer 114 to sufficiently fill a remaining portion of each of the channel holes. In example embodiments, the channel layer 114 may be formed of doped or undoped polysilicon or amorphous silicon. In some example embodiments, the channel layer 114 may be formed to sufficiently fill the channel holes, and the filling pattern may not be formed.

Upper portions of the dielectric structure 112, the channel layer 114 and the filling pattern 116 in each of the channel holes may be removed by an etch back process to form a recess. A pad layer may be formed to fill the recess, and an upper portion of the pad layer may be planarized to form a pad pattern 118. In example embodiments, the pad pattern 118 may be formed of polysilicon, e.g., polysilicon doped with n-type impurities. In example embodiments, the planarization process may be performed by a chemical mechanical polishing (CMP) process and/or an etch back process.

The channel structure 120 including the semiconductor pattern 110, the channel layer 114, the filling pattern 116, the dielectric structure 112, and the pad pattern 118 may be formed in each of the channel holes.

Figure 3:
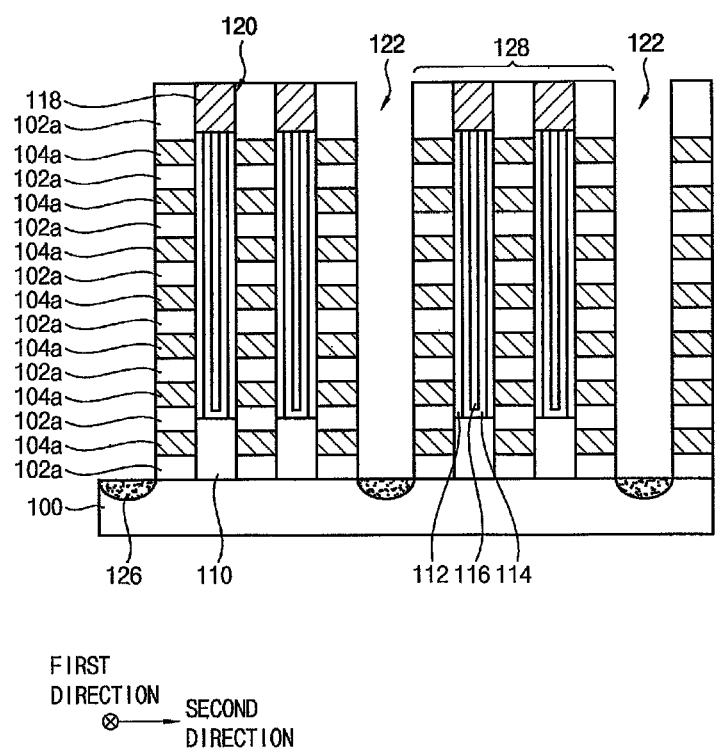

Referring to FIG. 3, the mold structure 106 may be anisotropically etched to form a first opening 122 exposing an upper surface of the substrate 100. The first opening 122 may extend in a first direction. The mold structure 106 may be divided into a plurality of first mold structures 128 spaced apart from each other in a second direction substantially perpendicular to the first direction by the first opening 122.

Each of the first mold structure 128 may include insulating patterns 102a and sacrificial patterns 104a alternately and repeatedly stacked. The first mold structure 128 may surround a plurality of the channel structures 120 arranged in the second direction, and may extend in the first direction.

An impurity region 126 may be formed at an upper portion of the substrate 100 exposed by the first opening 122. The impurity region 126 may be doped with n-type impurities, e.g., phosphorus (P) or arsenic (As).

Figure 4:
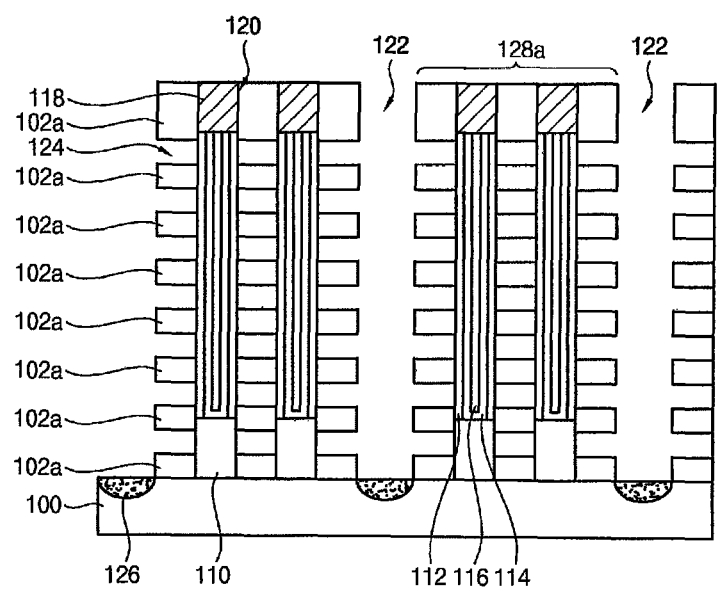

Referring to FIG. 4, the sacrificial patterns 104a exposed by the first opening 122 may be removed to form a second mold structure 128a including the gaps 124 between neighboring ones of the insulating patterns 102a in the vertical direction. An outer sidewall of the channel structure 120 may be exposed by the gaps 124.

In example embodiments, the sacrificial patterns 104a may be removed by a wet etch process using an etchant having an etching selectivity between the sacrificial patterns 104a and the insulating patterns 102a. For example, the etchant may include an acidic solution such as phosphoric acid or sulfuric acid.

Figure 5:
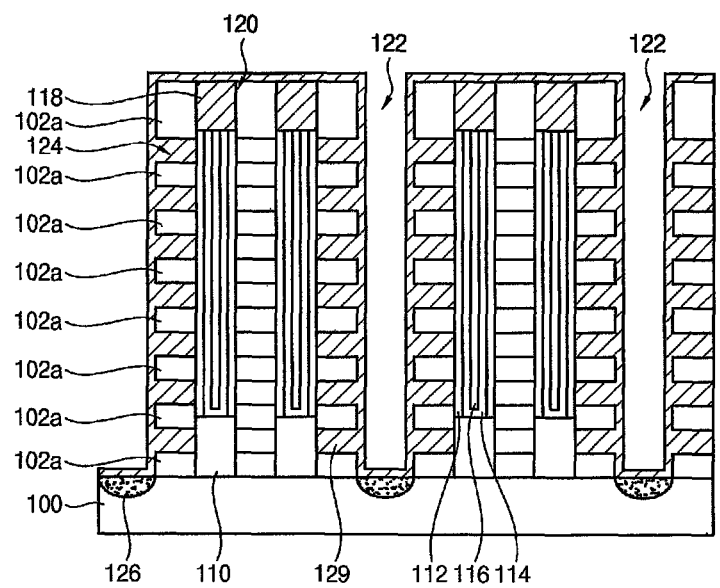

Referring to FIG. 5, a gate electrode layer 129 may be formed on a sidewall of the first opening 122, a top surface of the second mold structure 128a and an upper surface of the substrate 100 exposed by the first opening 122 to fill the gaps 124.

The gate electrode layer 129 may be formed of a metal and/or a metal nitride. For example, the gate electrode layer 129 may be formed of, e.g., a metal having a low resistance, e.g., tungsten, titanium, tantalum, platinum, cobalt, molybdenum, iridium, or ruthenium; or a metal nitride, e.g., tungsten nitride, titanium nitride, or tantalum nitride. In example embodiments, the gate electrode layer 129 may be formed to have a barrier layer including the metal nitride and a metal layer including the metal. For example, the gate electrode layer 129 may include a tantalum nitride layer and a tungsten layer substantially stacked. The gate electrode layer 129 may be formed by, e.g., a CVD process or an ALD process.

Figure 6:
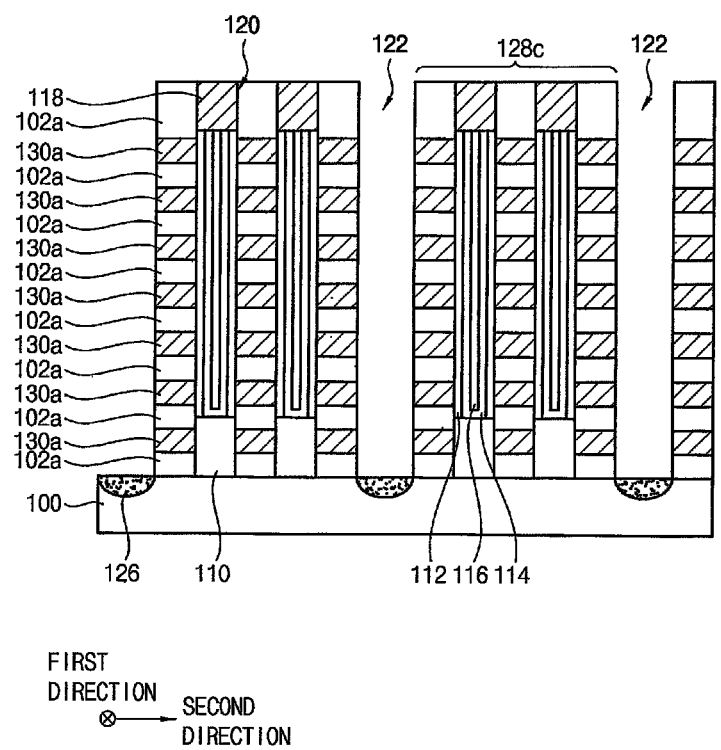

Referring to FIG. 6, the gate electrode layer 129 on the sidewall of the first opening 122, the top surface of the second mold structure 128a, and the upper surface of the substrate 100 exposed by the first opening 122 may be selectively removed to form the gate line 130a in each of the gaps 124. The gate line 130a may extend in the first direction, and a structure 128c including the insulating patterns 102a and the gate lines 130a alternately and repeatedly stacked and the channel structure 120 may be formed, which may extend in the first direction.

Referring to FIGS. 7 and 8, a preliminary buffer oxide layer 132 may be conformally formed on a sidewall and a top surface of the structure 128c and the upper surface of the substrate 100 exposed by the first opening 122.

The preliminary buffer oxide layer 132 may be formed of, e.g., silicon oxide. The preliminary buffer oxide layer 132 may be formed by, e.g., a CVD process, a PE-CVD process, or an ALD process. A concentration of hydrogen in the preliminary buffer oxide layer 132 may vary according to the type of the deposition process. For example, a concentration of hydrogen in the preliminary buffer oxide layer 132 formed by an ALD process may be higher than a concentration of hydrogen in the preliminary buffer oxide layer 132 formed by a CVD process or a PE-CVD process.

During forming the preliminary buffer oxide layer 132, exposed surfaces of the gate lines 130a may be oxidized, and a metal oxide layer 134 may be formed between each of the gate lines 130a and the preliminary buffer oxide layer 132. In example embodiments, each of the gate lines 130a may include a barrier pattern 129a and a tungsten pattern 129b, and the metal oxide layer 134 may include tungsten oxide.

Due to, for example, the oxidation of the surfaces of the gate lines 130a, metal components in the gate lines 130a may decrease, and the resistance of the gate lines 130a may increase.

The preliminary buffer oxide layer 132 on the metal oxide layer 134 may have a vacancy and/or a lattice defect, and a density of the preliminary buffer oxide layer 132 may be lowered. The preliminary buffer oxide layer 132 may have a low etch resistance with respect to a cleaning solution or a wet etchant for cleaning the preliminary buffer oxide layer 132, and the preliminary buffer oxide layer 132 may be excessively removed by the cleaning solution or the wet etchant. For example, the cleaning solution may include, e.g., a mixture of hydrochloric acid, hydrogen peroxide, and deionized water; a mixture of ammonia, hydrogen peroxide, and deionized water; a mixture of sulfuric acid, hydrogen peroxide, and deionized water; or diluted acid solution, and the metal oxide layer 134 and the preliminary buffer oxide layer 132 may not prevent the metal in each of the gate lines 130a from outgassing during subsequent processes. The metal oxide layer 134 and the preliminary buffer oxide layer 132 may not be proper to serve as a capping layer for preventing metal contamination.

Referring to FIGS. 9 and 10, the metal oxide layer 134 may be deoxidized to be removed. The preliminary buffer oxide layer 132 may be transformed into a buffer oxide layer 132a having a density higher than a density of the preliminary buffer oxide layer 132.

For example, a plasma treatment may be performed on the preliminary buffer oxide layer 132. The plasma treatment may be performed at a temperature of about 300° C. to about 600° C. using an inert gas or a mixture of an inert gas and hydrogen gas. For example, the inert gas may include, e.g., argon, helium, neon, krypton, or xenon.

In example embodiments, the plasma treatment and the process for forming the preliminary buffer oxide layer 132 may be performed in-situ. In example embodiments, the plasma treatment and the process for forming the preliminary buffer oxide layer 132 may be performed ex-situ.

In example embodiments, when the plasma treatment is performed, a bond between metal and oxygen in the metal oxide layer 134 may be separated by the plasma treatment, metal oxide may be reduced to metal, and the oxygen may be combined with hydrogen, vacancies, or dangling bonds in the preliminary buffer oxide layer 132. Impurities such as carbon, hydrogen, and/or nitrogen in the preliminary buffer oxide layer 132 may be separated from silicon in the preliminary buffer oxide layer 132, the vacancies may be removed by the combination with the oxygen, bonds between silicon and oxygen may be generated in the preliminary buffer oxide layer 132, and the buffer oxide layer 132a may have a density and a strength higher than a density and a strength of the preliminary buffer oxide layer 132.

The buffer oxide layer 132a may have a high etch resistance with respect to the cleaning solution or the wet etchant, and when the same cleaning solution or the same wet etchant is used, an etch rate of the buffer oxide layer 132a may be lower than an etch rate of the preliminary buffer oxide layer 132.

When the mixture of the inert gas and hydrogen gas is used in the plasma treatment, the oxygen in the metal oxide layer 134 may be actively reacted with the hydrogen gas, the metal oxide layer 134 may be effectively removed, and the etch rate of the buffer oxide layer 134 may be further decreased.

Figure 11:
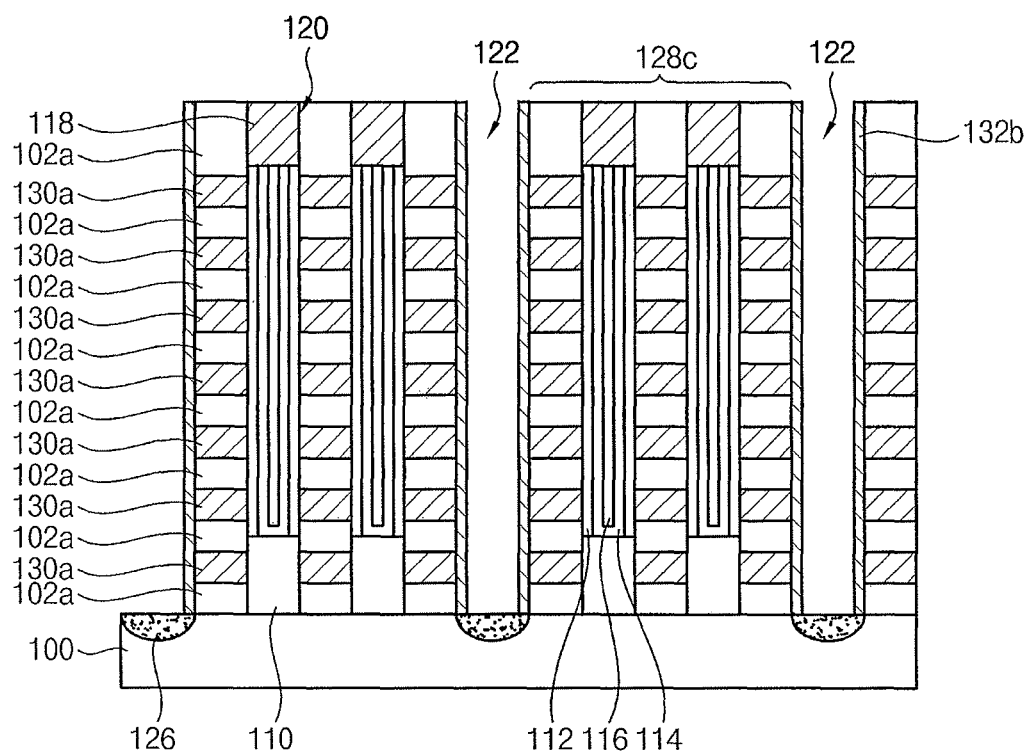

Referring to FIG. 11, the buffer oxide layer 134 may be anisotropically etched to form a buffer oxide pattern 132b on the sidewall of the structure 128c. The buffer oxide pattern 132b may serve as a capping pattern covering a sidewall of each of the gate lines 130a.

By the anisotropic etching process, the buffer oxide layer 132a on the top surface of the structure 128c and the bottom of the first opening 122 may be removed, and an upper surface of the substrate 100 may be exposed again.

In example embodiments, after forming the buffer oxide pattern 132b, the plasma treatment may be further performed on the buffer oxide pattern 132b.

In example embodiments, the preliminary buffer oxide layer 132 may be etched to form a preliminary buffer oxide pattern on the sidewall of the structure 128c without performing the plasma treatment. The plasma treatment may be performed on the preliminary buffer oxide pattern to form the buffer oxide pattern 132b having a density higher than a density of the preliminary buffer oxide pattern. The metal oxide layer 134 on the preliminary buffer oxide layer 132 may be removed by the plasma treatment.

A wet cleaning process may be performed on the buffer oxide pattern 132b using a cleaning solution. For example, the cleaning solution may include, e.g., a mixture of hydrochloric acid, hydrogen peroxide, and deionized water; a mixture of ammonia, hydrogen peroxide, and deionized water; a mixture of sulfuric acid, hydrogen peroxide, and deionized water; or diluted acid solution.

The buffer oxide pattern 132b may have a high etch resistance with respect to the cleaning solution or the wet etchant, the buffer oxide pattern 132b may not be removed or may be slightly removed, and the buffer oxide pattern 132b may not be damaged by the wet cleaning process.

The buffer oxide pattern 132b may have a high density, the outgassing of metal in, e.g., from, each of the gate lines 130a may decrease, and the metal contamination due to, for example, the outgassing, may decrease.

Figure 12:
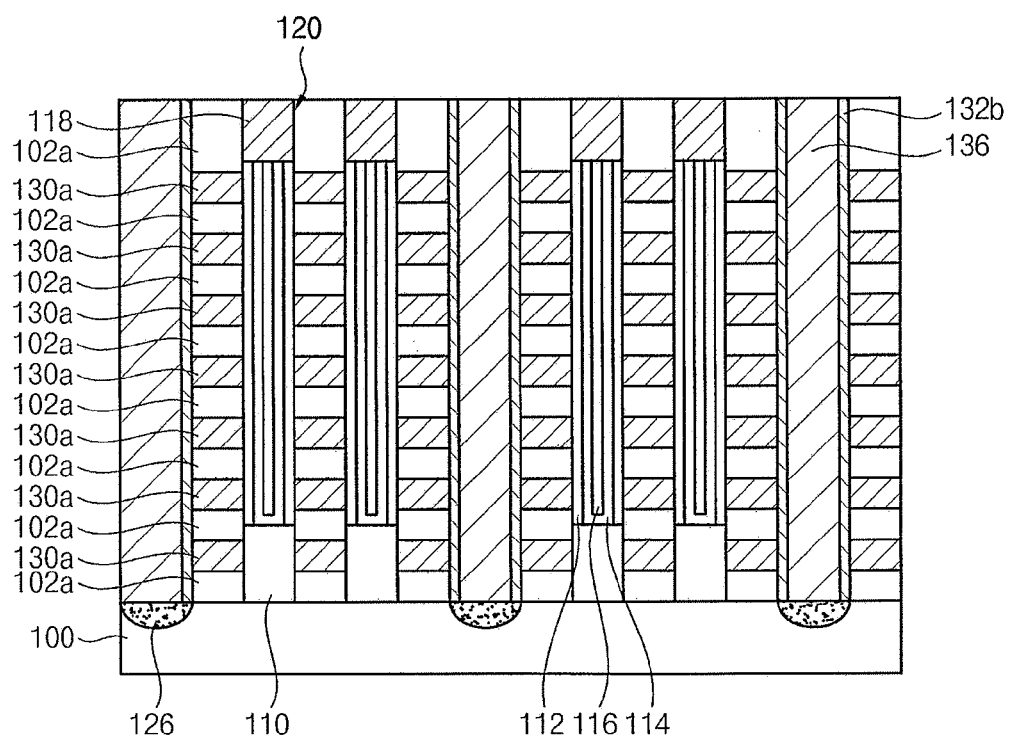

Referring to FIG. 12, a common source line (CSL) 136 may be formed on the exposed upper surface of the substrate 100 and the buffer oxide pattern 132b to fill the first opening 122.

In example embodiments, a conductive layer may be formed on the exposed upper surface of the substrate 100 and the buffer oxide pattern 132b to fill the first opening 122, and may be planarized until the top surface of the structure 128c may be exposed to form the common source line 136.

The common source line 136 may contact the substrate 100, and may extend in the first direction.

The common source line 136 and the gate lines 130a may be electrically insolated by the buffer oxide pattern 132b.

As described above, the buffer oxide pattern 132b may have a high density, and the metal contamination due to, for example, the outgassing or diffusion of metal, may decrease. The metal oxide layer between the buffer oxide pattern 132b and each of the gate lines 130a may be removed, and the resistance of the gate lines 130a may decrease.

Figure 13:
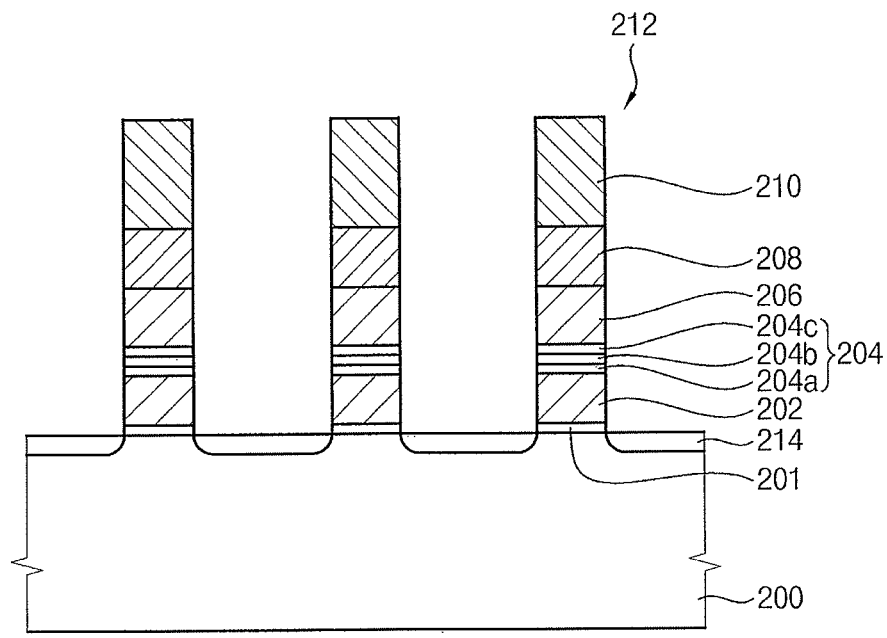
FIGS. 13 to 15 illustrate cross-sectional views of stages of a method of manufacturing a semiconductor device in accordance with example embodiments.
Figure 14:
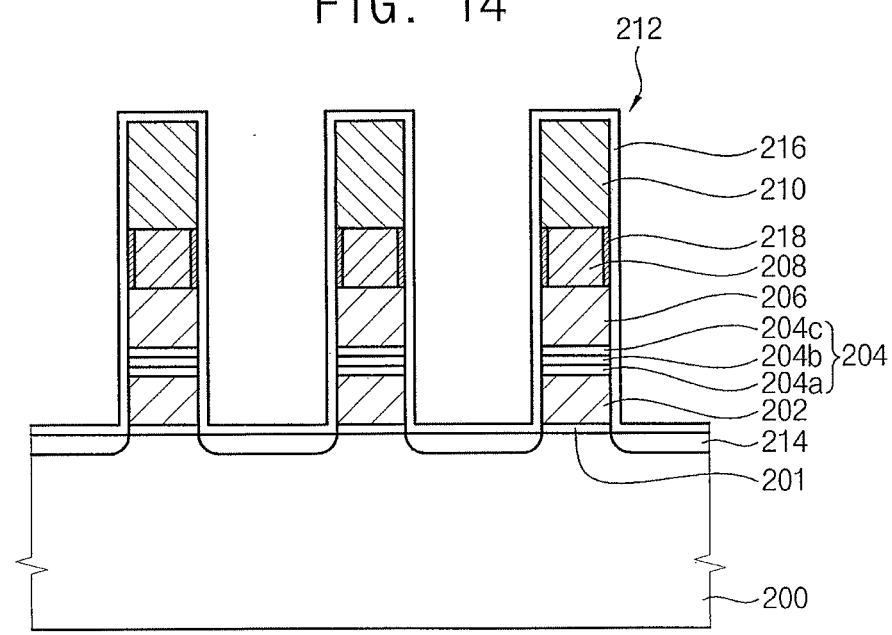
Figure 15:
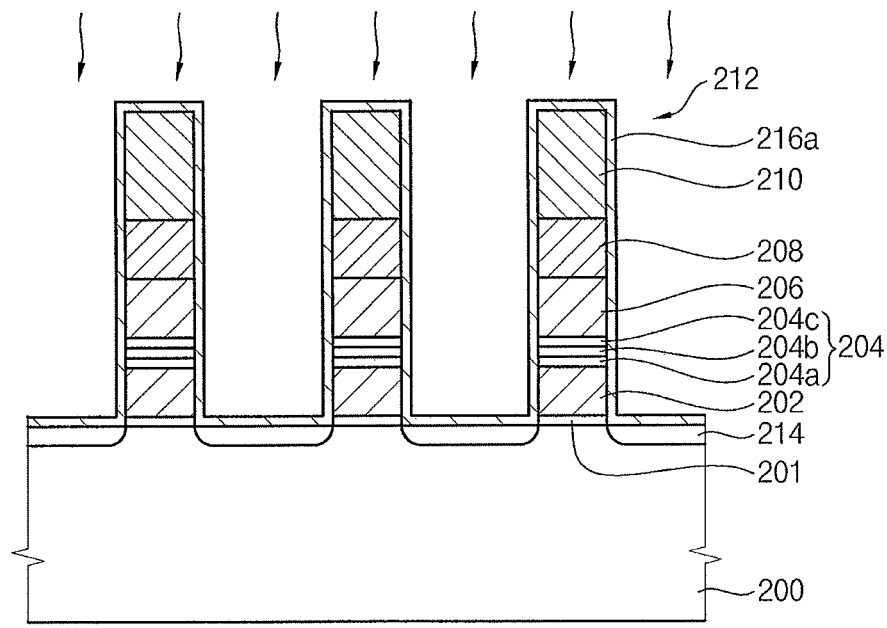

FIGS. 13 to 15 illustrate cross-sectional views of a semiconductor device in accordance with example embodiments.

In example embodiments, the semiconductor device may be a planar-type non-volatile memory device. In the planar-type non-volatile memory device, each of memory cells may include a floating gate.

Referring to FIG. 13, a gate structure 212 may be formed on a substrate 200. The gate structure 212 may include a tunnel insulation pattern 201, a floating gate 202, a dielectric structure 204, a first control gate 206, a second control gate 208, and a hard mask 210 sequentially stacked. Impurity regions 214 may be formed at upper portions of the substrate 200 adjacent to the gate structure 212.

For example, a tunnel insulation layer may be formed on the substrate 200. The tunnel insulation layer may be formed of, e.g., silicon oxide by a thermal oxidation process, a CVD process, or an ALD process.

A preliminary floating gate may be formed on the tunnel insulation layer. The preliminary floating gate may be formed of silicon or silicon germanium. The preliminary floating gate may extend in a first direction. The preliminary floating gate may be doped with impurities, e.g., boron.

A dielectric layer, a first control gate layer, and a second control gate layer may be sequentially formed on the preliminary floating gate.

The dielectric layer may include a silicon oxide layer, a silicon nitride layer, and a silicon oxide layer sequentially stacked. The first control gate layer may be formed of, e.g., doped polysilicon. The second control gate layer may be formed of, e.g., a metal and/or a metal nitride. In example embodiments, the second control gate layer may include, e.g., a metal having a low resistance, e.g., tungsten, titanium, tantalum, platinum, cobalt, molybdenum, iridium, or ruthenium; or a metal nitride, e.g., tungsten nitride, titanium nitride, or tantalum nitride.

In some example embodiments, the second control gate layer may include a barrier layer including a metal nitride and a metal layer including a metal. In example embodiments, the second control gate layer may include tungsten.

In some example embodiments, the first control gate layer may not be formed. For example, the second control gate layer including a metal may be formed directly on the dielectric layer.

The hard mask 210 may be formed on the second control gate layer, and may extend in a second direction substantially perpendicular to the first direction. The hard mask 210 may be formed of, e.g., silicon nitride or silicon oxynitride.

The second control gate layer, the first gate control layer, the dielectric layer, the preliminary floating gate, and the tunnel insulation layer may be anisotropically etched using the hard mask 210 an etching mask to form the gate structure 212. The gate structure 212 may include the tunnel insulation pattern 201, the floating gate 202, the dielectric structure 204, the first control gate 206, the second control gate 208, and the hard mask 210. The dielectric structure 204 may include a silicon oxide pattern 204a, a silicon nitride pattern 204b, and a silicon oxide pattern 204c sequentially stacked.

Impurities may be doped into the upper portions of the substrate 200 adjacent to the gate structure 212 to form the impurity regions 214.

Referring to FIG. 14, a preliminary buffer oxide layer 216 may be conformally formed on surfaces of the gate structure 212 and the substrate 200.

The preliminary buffer oxide layer 216 may be formed by performing processes substantially the same as or similar to those illustrated with reference to FIGS. 7 and 8.

During forming the preliminary buffer oxide layer 216, a surface of the second control gate 208 may be oxidized, and a metal oxide layer 218 may be formed between the second control gate 208 and the preliminary buffer oxide layer 216. In example embodiments, the second control gate 208 may include tungsten, and the metal oxide layer 218 may include tungsten oxide.

Due to, for example, the oxidation of the surface of the second control gate 208, metal components in the second control gate 208 may decrease, and a resistance of the second control gate 208 may increase.

The preliminary buffer oxide layer 216 on the metal oxide layer 218 may have a vacancy and/or a lattice defect, and a density of the preliminary buffer oxide layer 216 may be lowered. The preliminary buffer oxide layer 216 may be excessively removed by a cleaning solution or a wet etchant.

Referring to FIG. 15, the metal oxide layer 218 may be deoxidized to be removed. The preliminary buffer oxide layer 216 may be transformed into a buffer oxide layer 216a having a density higher than a density of the preliminary buffer oxide layer 216.

For example, a plasma treatment may be performed on the preliminary buffer oxide layer 216. The plasma treatment may be performed at a temperature of about 300° C. to about 600° C. using an inert gas or a mixture of an inert gas and hydrogen gas. For example, the inert gas may include, e.g., argon, helium, neon, krypton, or xenon.

In example embodiments, the plasma treatment and the process for forming the preliminary buffer oxide layer 216 may be performed in-situ. In example embodiments, the plasma treatment and the process for forming the preliminary buffer oxide layer 216 may be performed ex-situ.

The plasma treatment may be substantially the same as or similar to those illustrated with reference to FIGS. 9 and 10.

In example embodiments, a spacer may be formed on the buffer oxide layer 216a on sidewalls of the gate structure 212. An insulating interlayer may be formed to fill a gap between the gate structures 212.

As described above, the surface of the gate structure 212 may be encapsulated by the buffer oxide layer 216a having a density higher than a density of the preliminary buffer oxide layer 216, and metal contamination due to, for example, an outgassing or a diffusion of metal in, e.g., from, the second control gate 208, may decrease. The metal oxide layer between the buffer oxide layer 216a and the second control gate 208 may be removed, and the resistance of the second control gate 208 may decrease.

Figure 16:
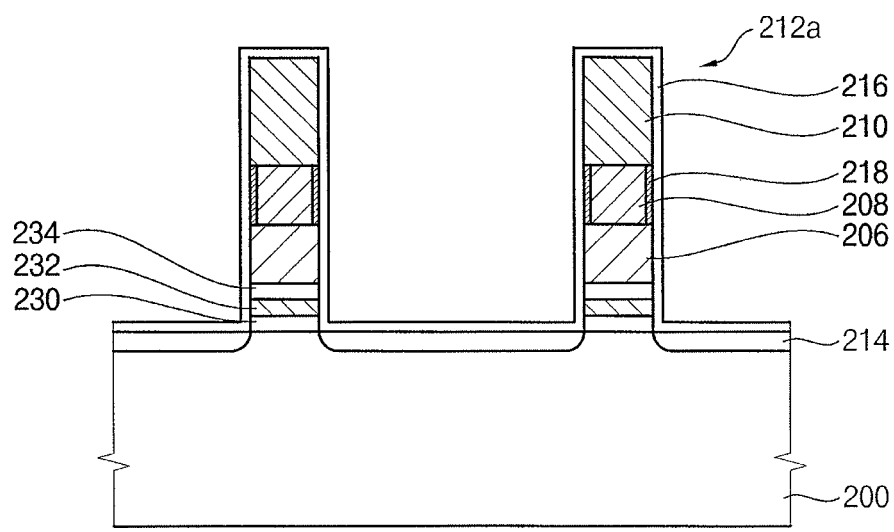
FIGS. 16 and 17 illustrate cross-sectional views of stages of a method of manufacturing a semiconductor device in accordance with example embodiments.
Figure 17:
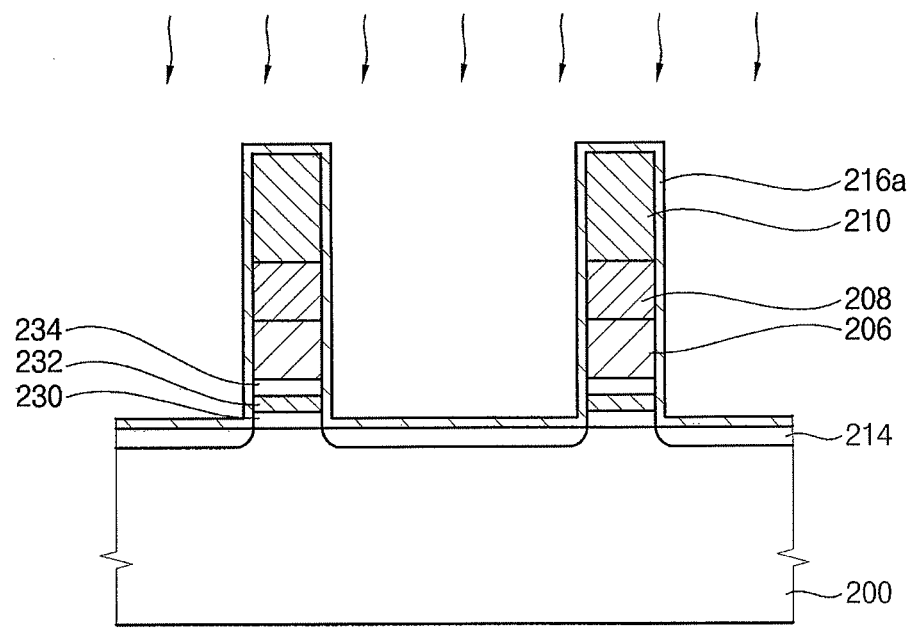

FIGS. 16 and 17 illustrate cross-sectional views of stages of a method of manufacturing a semiconductor device in accordance with example embodiments.

In example embodiments, the semiconductor device may be a planar-type non-volatile memory device. In the planar-type non-volatile memory device, each of memory cells may include a charge trap pattern.

Referring to FIG. 16, a gate structure 212a may be formed on a substrate 200. The gate structure 212a may include a tunnel insulation pattern 230, a charge trap pattern 232, a dielectric layer 234, a first control gate 206, a second control gate 208, and a hard mask 210 sequentially stacked. Impurity regions 214 may be formed at upper portions of the substrate 200 adjacent to the gate structure 212a. A preliminary buffer oxide layer 216 may be conformally formed on surfaces of the gate structure 212a and the substrate 200.

For example, a tunnel insulation layer may be formed on the substrate 200. A charge trap layer may be formed on the tunnel insulation layer. The charge trap layer may be formed of, e.g., silicon nitride.

A dielectric layer, a first control gate layer, and a second control gate layer may be formed on the charge trap layer.

The dielectric layer may include, e.g., silicon oxide or a metal oxide.

The first control gate layer may be formed of, e.g., doped polysilicon. The second control gate layer may be formed of, e.g., a metal and/or a metal nitride.

In some example embodiments, the first control gate layer may not be formed. For example, the second control gate layer including a metal and/or a metal nitride may be formed directly on the dielectric layer.

The hard mask 210 may be formed on the second control gate layer.

The second control gate layer, the first control gate layer, the dielectric layer, the charge trap layer, and the tunnel insulation layer may be anisotropically etched using the hard mask 210 an etching mask to form the gate structure 212a. The gate structure 212a may include the tunnel insulation pattern 230, the charge trap pattern 232, the dielectric pattern 234, the first control gate 206, the second control gate 208, and the hard mask 210.

The preliminary buffer oxide layer 216 may be formed by performing processes substantially the same as or similar to those illustrated with reference to FIGS. 7 and 8.

During forming the preliminary buffer oxide layer 216, a surface of the second control gate 208 may be oxidized, and a metal oxide layer 218 may be formed between the second control gate 208 and the preliminary buffer oxide layer 216.

Referring to FIG. 17, the metal oxide layer 218 may be deoxidized to be removed. The preliminary buffer oxide layer 216 may be transformed into a buffer oxide layer 216a having a density higher than a density of the preliminary buffer oxide layer 216.

For example, a plasma treatment may be performed on the preliminary buffer oxide layer 216. The plasma treatment may be performed at a temperature of about 300° C. to about 600° C. using an inert gas or a mixture of an inert gas and hydrogen gas. For example, the inert gas may include, e.g., argon, helium, neon, krypton, or xenon. The plasma treatment may be substantially the same as or similar to those illustrated with reference to FIGS. 9 and 10.

In example embodiments, a spacer may be formed on the buffer oxide layer 216a on sidewalls of the gate structure 212a. An insulating interlayer may be formed to fill a gap between the gate structures 212a.

As described above, metal contamination of the semiconductor device may decrease, and resistance of the second control gate may decrease.

Figure 18:
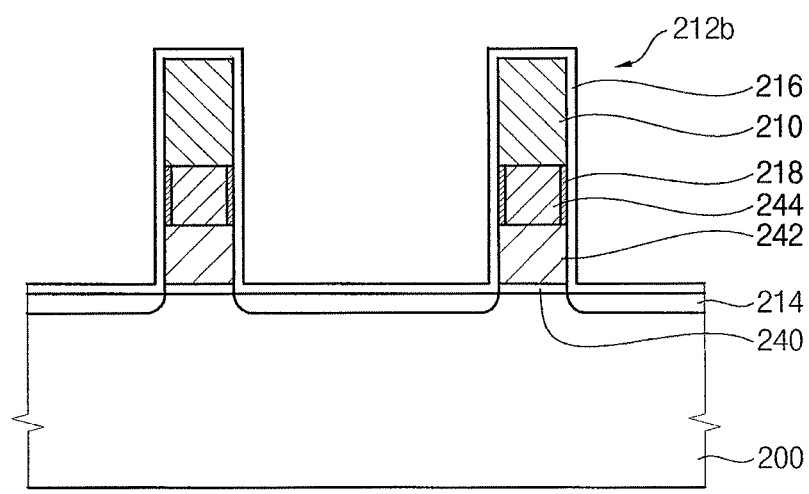
FIGS. 18 and 19 illustrate cross-sectional views of stages of a method of manufacturing a semiconductor device in accordance with example embodiments.
Figure 19:
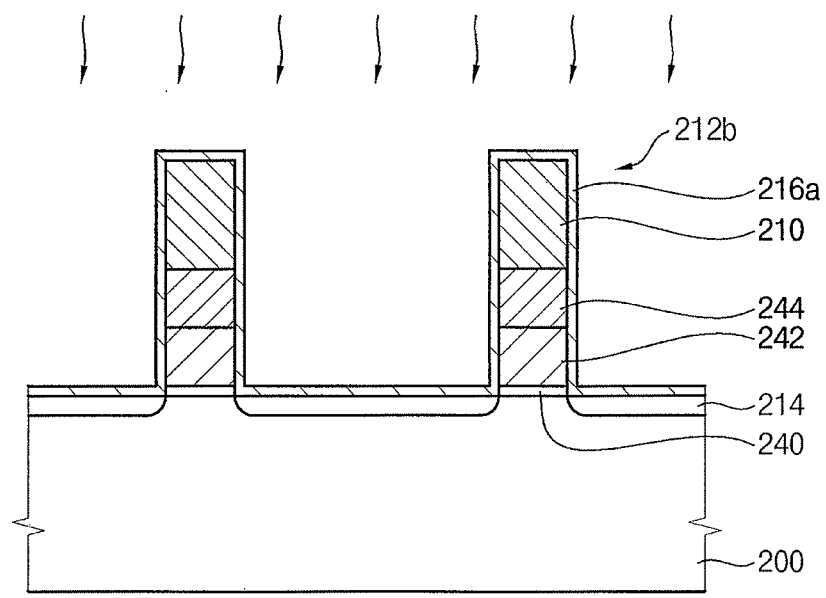

FIGS. 18 to 19 illustrate cross-sectional views of stages of a method of manufacturing a semiconductor device in accordance with example embodiments.

In example embodiments, the semiconductor device may be a planar-type MOS transistor.

Referring to FIG. 18, a gate structure 212b may be formed on a substrate 200. The gate structure 212b may include a gate insulation pattern 240, a first gate electrode 242, a second gate electrode 244, and a hard mask 210 sequentially stacked. Impurity regions 214 may be formed at upper portions of the substrate 200 adjacent to the gate structure 212b. A preliminary buffer oxide layer 216 may be conformally formed on surfaces of the gate structure 212b and the substrate 200.

For example, a gate insulation layer may be formed on the substrate 200.

A first gate electrode layer and a second electrode layer may be formed on the gate insulation layer. The first gate electrode layer may be formed of, e.g., doped polysilicon. The second gate electrode layer may be formed of, e.g., a metal and/or a metal nitride. In some example embodiments, the first gate electrode layer may not be formed.

The hard mask 210 may be formed on the second gate electrode layer. The second gate electrode layer, the first gate electrode layer, and the gate insulation layer may be anisotropically etched using the hard mask 210 an etching mask to form the gate structure 212b. The gate structure 212b may include the gate insulation pattern 240, the first gate electrode 242, the second gate electrode 244, and the hard mask 210.

The preliminary buffer oxide layer 216 may be formed by performing processes substantially the same as or similar to those illustrated with reference to FIGS. 7 and 8.

During forming the preliminary buffer oxide layer 216, a surface of the second gate electrode 244 including the metal may be oxidized, and a metal oxide layer 218 may be formed between the second gate electrode 244 and the preliminary buffer oxide layer 216.

Referring to FIG. 19, the metal oxide layer 218 may be deoxidized to be removed. The preliminary buffer oxide layer 216 may be transformed into a buffer oxide layer 216a having a density higher than a density of the preliminary buffer oxide layer 216.

For example, a plasma treatment may be performed on the preliminary buffer oxide layer 216. The plasma treatment may be performed at a temperature of about 300° C. to about 600° C. using an inert gas or a mixture of an inert gas and hydrogen gas. For example, the inert gas may include, e.g., argon, helium, neon, krypton, or xenon.

The plasma treatment may be substantially the same as or similar to those illustrated with reference to FIGS. 9 and 10.

In example embodiments, a spacer may be formed on the buffer oxide layer 216a on sidewalls of the gate structure 212b. An insulating interlayer may be formed to fill a gap between the gate structures 212b.

As described above, metal contamination of the semiconductor device may decrease, and resistance of the second gate electrode 244 may decrease.

FIGS. 20 to 25 illustrate cross-sectional views of stages of a method of manufacturing a semiconductor device in accordance with example embodiments.

Figure 20:
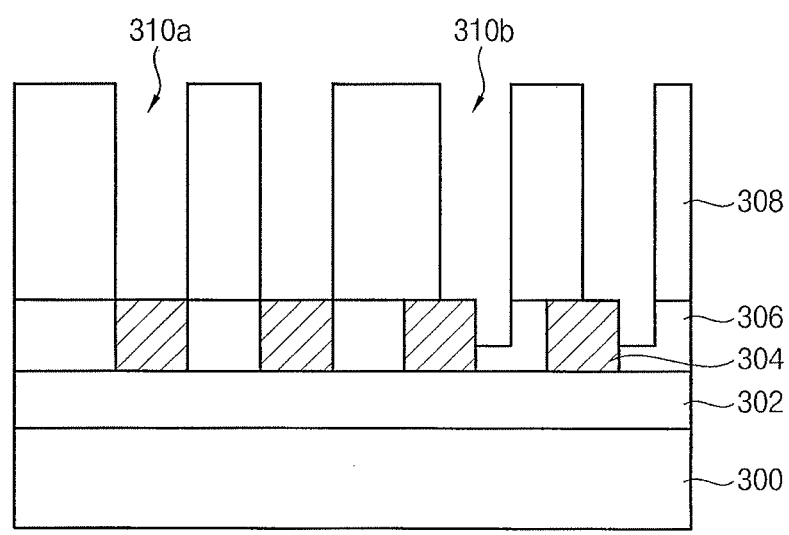
FIGS. 20 to 25 illustrate cross-sectional views of stages of a method of manufacturing a semiconductor device in accordance with example embodiments.

Referring to FIG. 20, a lower insulation layer 302, pad patterns 304, a first insulating interlayer 306, and a second insulating interlayer 308 may be formed on a substrate 300. The second insulating interlayer 308 may be etched to form openings 310a and 310b exposing surfaces of the pad patterns 304.

In example embodiments, a circuit element such as a transistor may be formed on the substrate 300. The lower insulation layer 302 may be formed to cover the circuit element. The lower insulation layer 302 may be formed of, e.g., silicon oxide.

The pad patterns 304 may be formed on the lower insulation layer 302. The pad patterns 304 may be regularly arranged in each other. In example embodiments, the pad patterns 304 may include doped-polysilicon. The first insulating interlayer 306 may be formed to fill a gap between the pad patterns 304. In example embodiments, top surfaces of the pad patterns 304 and the first insulating interlayer 306 may be substantially coplanar with each other.

The second insulating interlayer 308 may be formed on the pad patterns 304 and the first insulating interlayer 306. The first and second insulating interlayers 306 and 308 may include silicon oxide. In example embodiments, an etch stop layer may be formed between the first and second insulating interlayer 306 and 308.

The second insulating interlayer 308 may be etched by a photolithograph process to form the openings 310a and 310b.

The openings 310a and 310b may include first openings 310a formed without a photo misalignment or second openings 310b formed with a photo misalignment. The second opening 310b may be formed away from a normal position. In example embodiments, the openings may include only the first openings 310a or only the second openings 310b. In example embodiments, the openings may include both of the first and second openings 310a and 310 b.

Each of the first openings 310a may expose a top surface of each of the pad patterns 304. Each of the second openings 310b may be formed at an edge portion of a top surface of each of the pad patterns 304 and the first insulating interlayer 306 adjacent to each of the pad patterns 304, and each of the second openings 310a may expose an upper sidewall and the edge portion of the top surface of each of the pad patterns 304. A bottom of each of the second openings 310b may be lower than a bottom of each of the first openings 310a.

Figure 21:
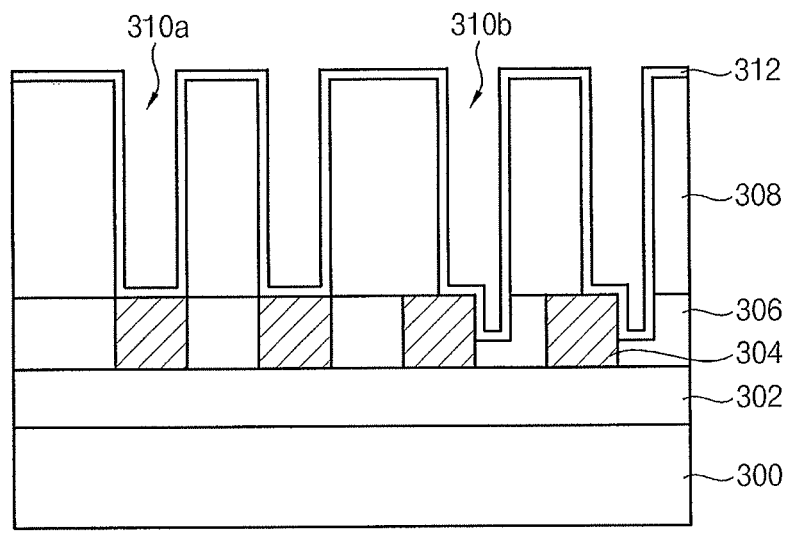

Referring to FIG. 21, a preliminary buffer oxide layer 312 may be conformally formed on the sidewalls of the first and second openings 310a and 310b, surfaces of the pad patterns 304 exposed by the first and second openings 310a and 310b, and a top surface of the second insulating interlayer 308.

The preliminary buffer oxide layer 312 may be formed by performing processes substantially the same as or similar to those illustrated with reference to FIGS. 7 and 8.

The preliminary buffer oxide layer 312 may cover the top surface of the pad pattern 304 in each of the first openings 310a and the sidewall and the edge portion of the top surface of the pad pattern 304 in each of the second openings 310b.

The preliminary buffer oxide layer 312 may have a vacancy and/or a lattice defect, and a density of the preliminary buffer oxide layer 312 may be lowered. The preliminary buffer oxide layer 312 may have a low etch resistance with respect to a cleaning solution or a wet etchant for cleaning the preliminary buffer oxide layer 312, and the preliminary buffer oxide layer 312 may be excessively removed by the cleaning solution or the wet etchant.

During forming the preliminary buffer oxide layer 312, surfaces of the pad patterns 304 may be oxidized to form an oxide. In example embodiments, the pad patterns 304 may be formed of polysilicon, the oxide formed on surface of the pad patterns 304 may be substantially the same as the preliminary buffer oxide layer 312, and an interface layer such as a metal oxide may not be formed between each of the pad patterns 304 and the preliminary buffer oxide layer 312.

Figure 22:
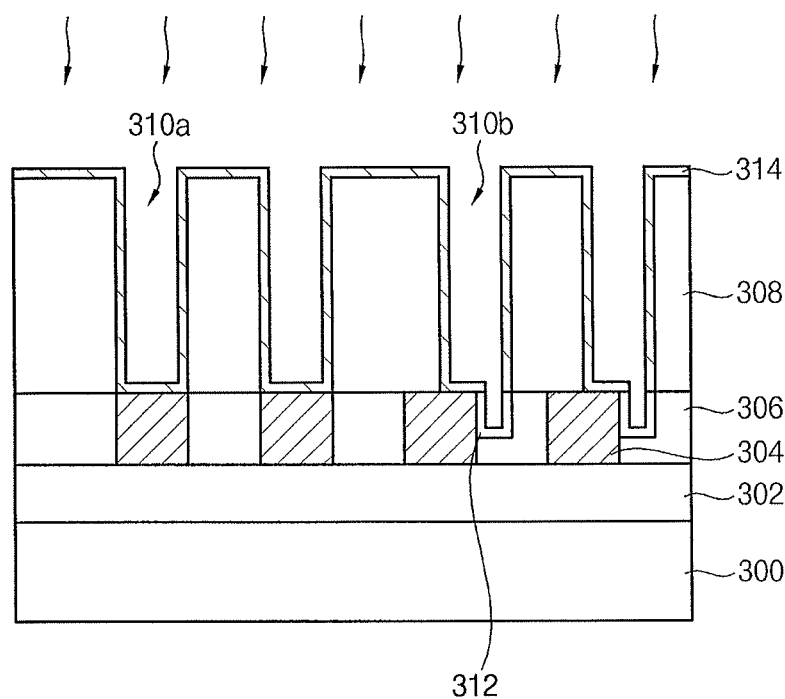

Referring to FIG. 22, a plasma treatment may be performed on the preliminary buffer oxide layer 312, and the preliminary buffer oxide layer 312 may be transformed into a buffer oxide layer 314 having a density higher than a density of the preliminary buffer oxide layer 312. The plasma treatment may be substantially the same as or similar to those illustrated with reference to FIGS. 9 and 10.

In example embodiments, the plasma treatment may be selectively performed on a surface of the preliminary buffer oxide layer 312 positioned higher than the top surface of each of the pad patterns 304, and the buffer oxide layer 314 may be formed on the second insulating interlayer 308 and inner surfaces of the first and second openings 310a and 310b positioned higher than the top surface of each of the pad patterns 304. The preliminary oxide layer 312 may remain on inner surfaces of the second openings 310b positioned lower than the top surface of each of the pad patterns 304.

Figure 23:
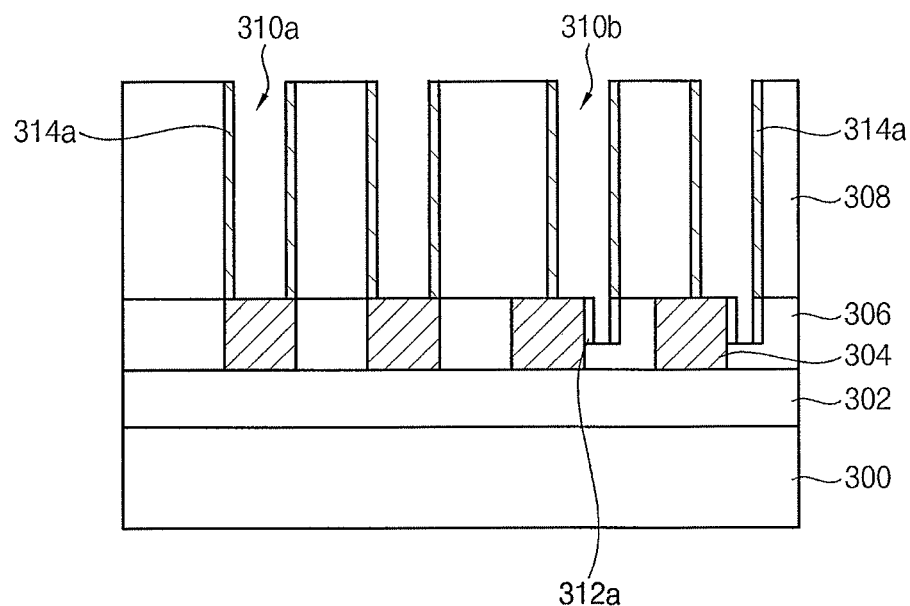

Referring to FIG. 23, the buffer oxide layer 314 and the preliminary buffer oxide layer 312 may be anisotropically etched to form a buffer oxide pattern 314a and a preliminary buffer oxide pattern 312a. The buffer oxide pattern 314a may be formed on the sidewall of each of the first openings 310a and an upper sidewall of each of the second openings 310b, and the preliminary buffer oxide pattern 312a may be formed on a lower sidewall of each of the second openings 310b. By the anisotropic etching process, an upper surface of each the pad patterns 304 may be exposed by the first and second openings 310a and 310b.

For example, the buffer oxide pattern 314a having a relatively high density may be formed on the sidewall of each of the first openings 310a. The buffer oxide pattern 314a may have formed on the sidewall of each of the second openings 310b positioned higher than the top surface of each of the pad patterns 304. The preliminary buffer oxide pattern 314a may have formed on the sidewall of each of the second openings 310b positioned lower than a top surface of each of the pad patterns 304. The preliminary buffer oxide pattern 312a may be formed on the upper sidewall each of the pad patterns 304 exposed by the second opening.

In example embodiments, after forming the buffer oxide pattern 314a and the preliminary buffer oxide pattern 312a, the plasma treatment may be further performed on the buffer oxide pattern 314a.

In example embodiments, the preliminary buffer oxide layer 312 may be anisotropically etched to form preliminary buffer oxide patterns on sidewalls of the first and second openings 310a and 310b without a plasma treatment of the preliminary buffer oxide layer 312. Then, a plasma treatment may be selectively performed on the preliminary buffer oxide pattern positioned higher than the top surface of each of the pad patterns 304 to form a buffer oxide pattern 314a. The buffer oxide pattern 314a may be formed on the sidewalls of the first and second openings 310a and 310b higher than the top surface of each of the pad patterns 304, and may have a density higher than a density of the preliminary buffer oxide pattern.

Figure 24:
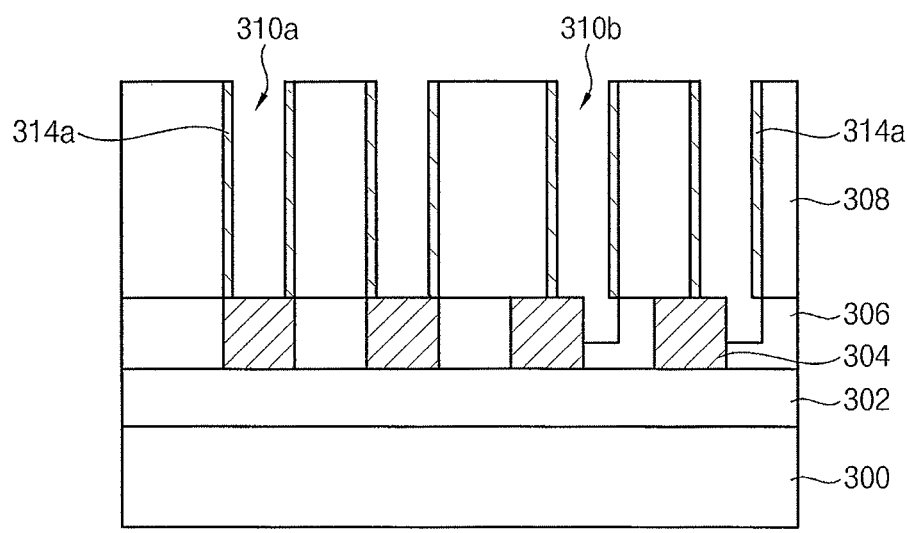

Referring to FIG. 24, the buffer oxide pattern 314a and the preliminary buffer oxide pattern 312a may be wet cleaned using a cleaning solution to selectively remove the preliminary buffer oxide pattern 312a, and the buffer oxide pattern 314a may be formed on the sidewalls of the first and second openings 310a and 310b.

For example, the cleaning solution may include, e.g., a mixture of hydrochloric acid, hydrogen peroxide, and deionized water; a mixture of ammonia, hydrogen peroxide, and deionized water; a mixture of sulfuric acid, hydrogen peroxide, and deionized water; or diluted acid solution.

The buffer oxide pattern 314a may have a high density, the buffer oxide pattern 314a may not be removed or may be slightly removed, and the buffer oxide pattern 314a may not be damaged by the wet cleaning process. The preliminary buffer oxide pattern 312a may be removed by the wet cleaning process, and the upper sidewall of each of the pad patterns 304 may be exposed by each of the second openings 310b.

Figure 25:
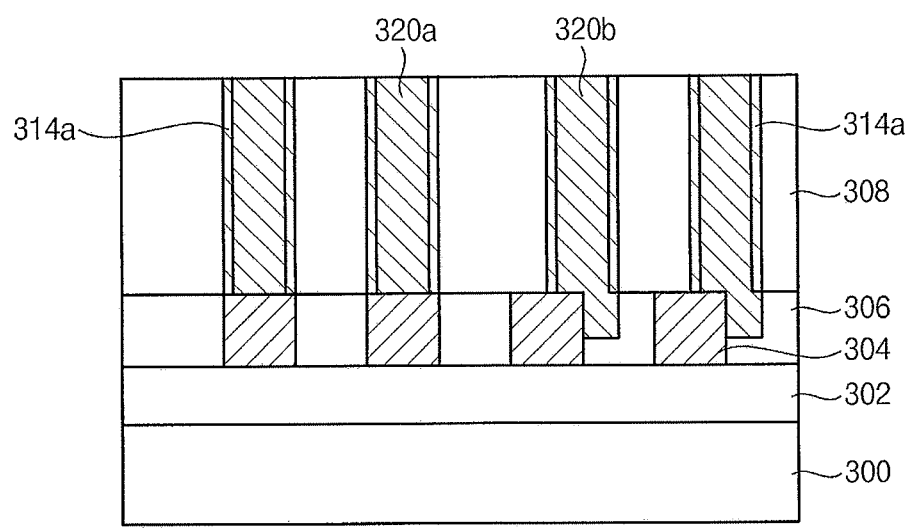

Referring to FIG. 25, first conductive patterns 320a and second conductive patterns 320b may be formed to fill the first openings 310a and the second openings 310b, respectively. Each of the first and second conductive patterns 320a and 320b may include a metal.

For example, a conductive layer may be formed on the buffer oxide pattern 313a and surfaces of the pad patterns 304a to fill the first and second openings 310a and 310b. The conductive layer may include a metal. In example embodiments, the conductive layer may include, e.g., a metal having a low resistance, e.g., tungsten, titanium, tantalum, platinum, cobalt, molybdenum, iridium, or ruthenium; or a metal nitride, e.g., tungsten nitride, titanium nitride, or tantalum nitride.

In some example embodiments, the conductive layer may include a barrier layer including a metal nitride and a metal layer including a metal. In example embodiments, the conductive layer may include a titanium nitride layer and a tungsten layer substantially stacked. The conductive layer may be formed by, e.g., a CVD process, an ALD process, or a PVD process.

Each of the buffer oxide pattern 314a may have a high density, and during forming the conductive layer, metal contamination due to, for example, a diffusion of the metal in conductive layer, may decrease.

The conductive layer may be planarized until a top surface of the second insulating interlayer 308 may be exposed to form the first and second conductive patterns 320a and 320b. In example embodiments, the planarization process may be performed by a CMP process and/or an etch back process. In example embodiments, the first and second conductive patterns 320a and 320b may serve as contact plugs or conductive lines.

Each of the first conductive patterns 320a may contact a top surface of each of the pad patterns 304. Each of the second conductive patterns 320b may contact on the upper sidewall and an edge portion of a top surface of each of the pad patterns 304, and a contact region between each of the second conductive patterns 320b and each of the pad patterns 304 may increase.

Figure 26:
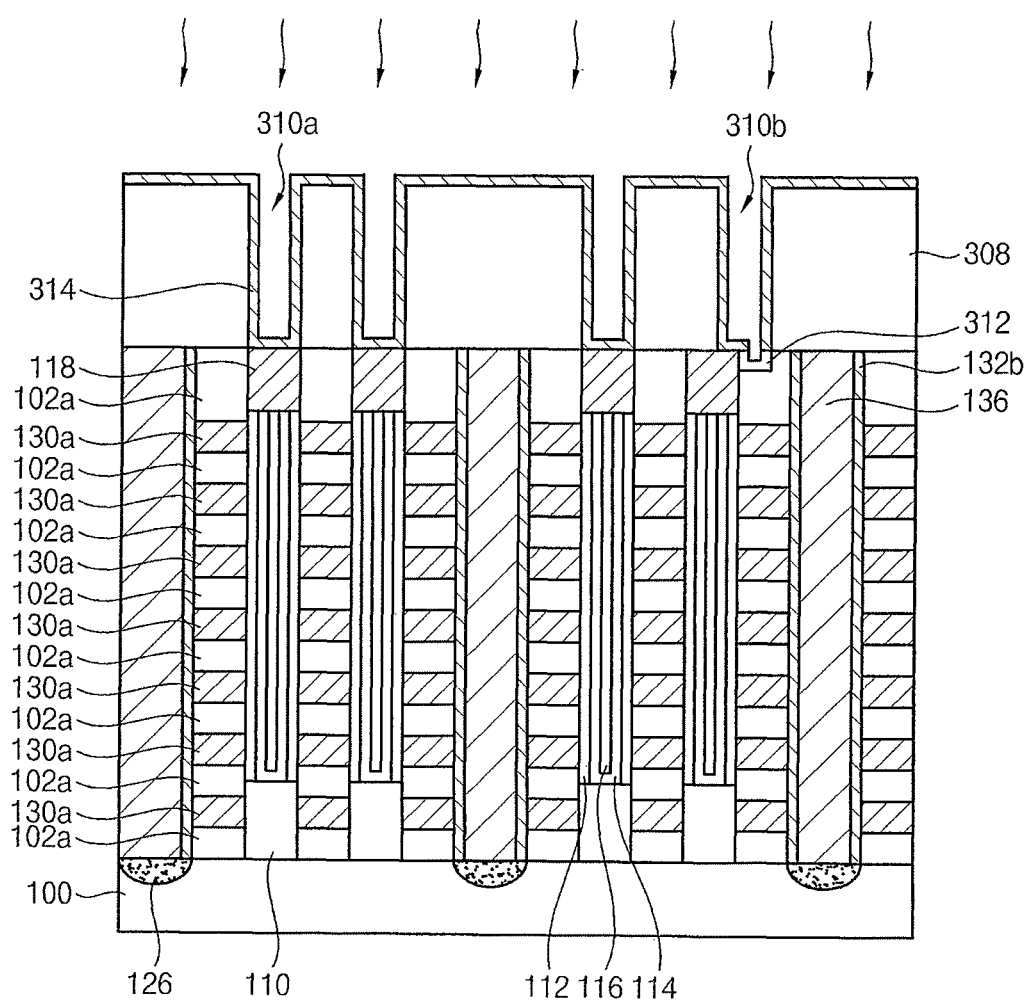
FIGS. 26 to 28 illustrate cross-sectional views of stages of a method of manufacturing a semiconductor device in accordance with example embodiments.
Figure 27:
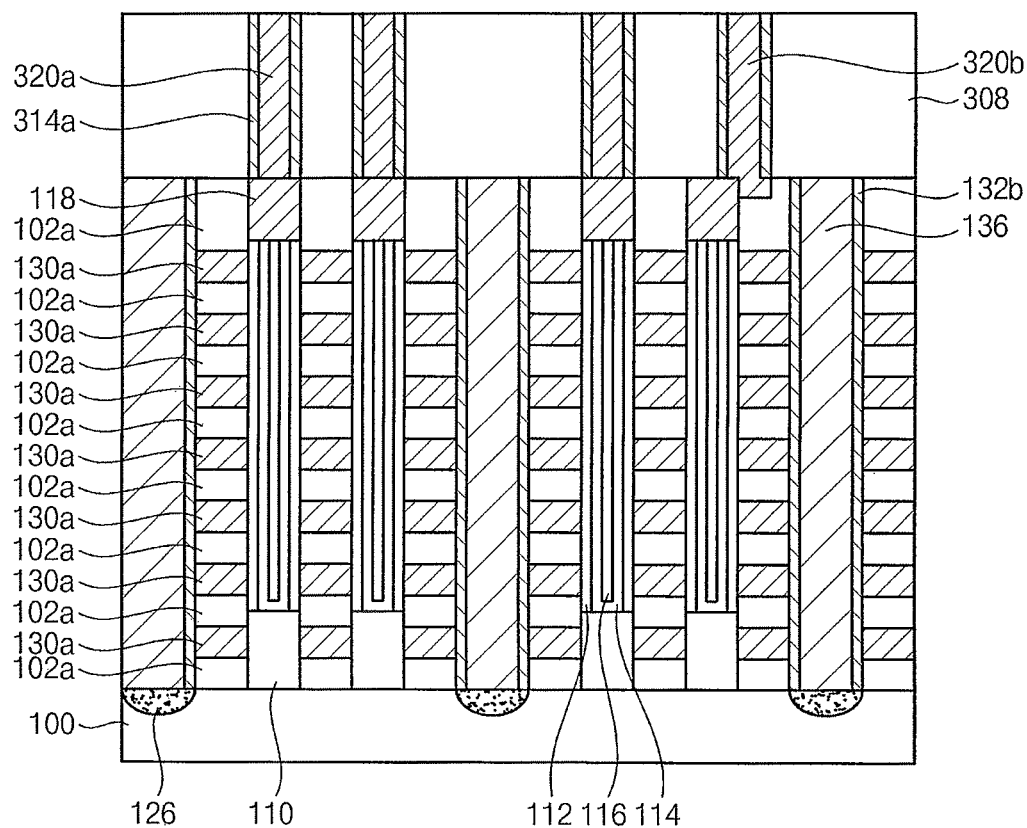
Figure 28:
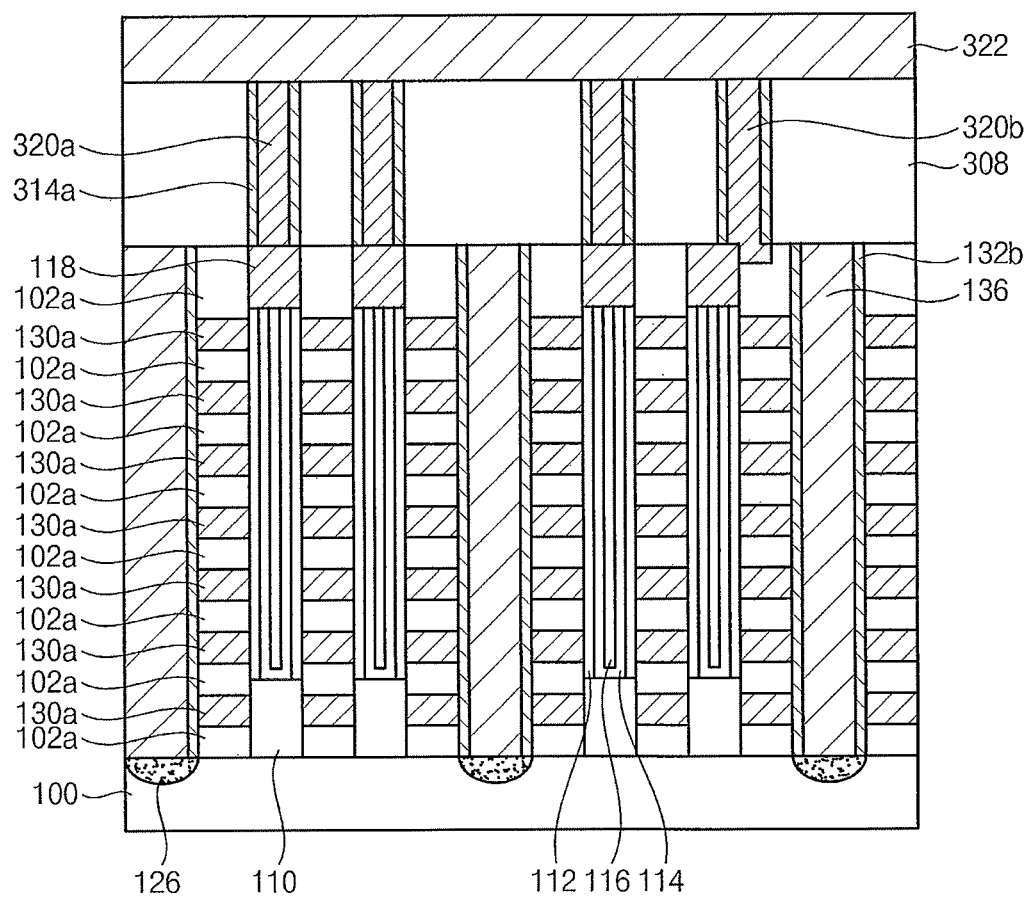

FIGS. 26 to 28 illustrate cross-sectional views of stages of a method of manufacturing a semiconductor device in accordance with example embodiments.

In example embodiments, the semiconductor device may be a vertical non-volatile memory device including conductive patterns formed by performing processes substantially the same as or similar to those illustrated with reference to FIGS. 20 to 25. The conductive patterns may serve as bit line contact plugs.

Referring to FIG. 26, memory cells may be formed by performing processes substantially the same as or similar to those illustrated with reference to FIGS. 1 to 12.

An upper insulating interlayer 308 may be formed on the pad patterns 118, the insulating interlayer pattern 102a, the buffer oxide pattern 132b, and the common source line 136. The upper insulating interlayer 308 may be etched to form openings 310a and 310b exposing a top surface of each of the pad patterns 118. A preliminary buffer oxide layer may be conformally formed on sidewalls of the openings 310a and 310b, surfaces of the pad patterns 118, and a top surface of the upper insulating interlayer 308. A plasma treatment may be performed on the preliminary buffer oxide layer, and a portion of the preliminary buffer oxide layer may be transformed into a buffer oxide layer 314 having a density higher than a density of the preliminary buffer oxide layer.

The pad patterns 118 may be formed of, e.g., polysilicon.

Each of the openings 310a and 310b may serve as a contact hole exposing each of the pad patterns 118. In example embodiments, the openings 310a and 310b may include first openings 310a formed without a photo misalignment or second openings 310b formed with a photo misalignment. Each of the second openings 310b may be formed away from a normal position.

Forming the preliminary buffer oxide layer and transforming the preliminary buffer oxide layer into the buffer oxide layer 314 may be substantially the same as or similar to those illustrated with reference to FIGS. 21 to 22, and the preliminary buffer oxide layer 312 positioned lower than a top surface of each of the pad patterns 118 may not be transformed into the buffer oxide layer 314.

Referring to FIG. 27, the buffer oxide layer 314 and the preliminary buffer oxide layer 312 may be anisotropically etched to form a buffer oxide pattern 314a and a preliminary buffer oxide pattern. The buffer oxide pattern 314a may be formed on the sidewall of each of the first openings 310a and an upper sidewall of each of the second openings 310b, and the preliminary buffer oxide pattern may be formed on a lower sidewall of each of the second openings 310b.

The buffer oxide pattern 314a and the preliminary buffer oxide pattern may be wet cleaned using a cleaning solution to selectively remove the preliminary buffer oxide pattern 312a, and an upper sidewall of each of the pad patterns 118 may be exposed by each of the second openings 310b.

A conductive layer may be formed on the buffer oxide layer 314a and the pad patterns 118 to fill the first and second openings 310a and 310b. The conductive layer may be planarized until a top surface of the upper insulating interlayer 308 may be exposed to form a first conductive pattern 320a and a second conductive pattern 320b. In example embodiments, the first and second conductive patterns 320a and 320b may serve as contact plugs. A contact region between each of the second conductive patterns 320b and each of the pad patterns 118 may increase.

The processes may be substantially the same as or similar to those illustrated with reference to FIGS. 23 to 25.

Referring to FIG. 28, a bit line 322 may be formed on the first and second conductive patterns 320a and 320b and the upper insulating interlayer 308, and may extend in a second direction substantially perpendicular to an extending direction of the gate line 130a.

As described above, a non-volatile memory device including a wiring structure having a low resistance may be manufactured.

Figure 29:
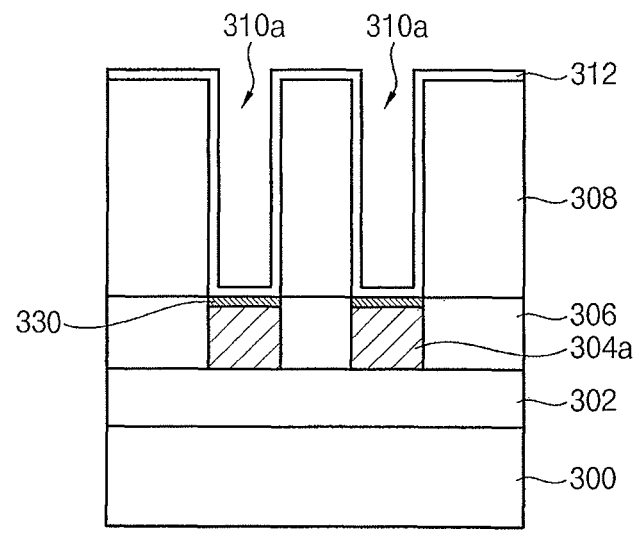
FIGS. 29 to 31 illustrate cross-sectional views of stages of a method of manufacturing a semiconductor device in accordance with example embodiments.
Figure 30:
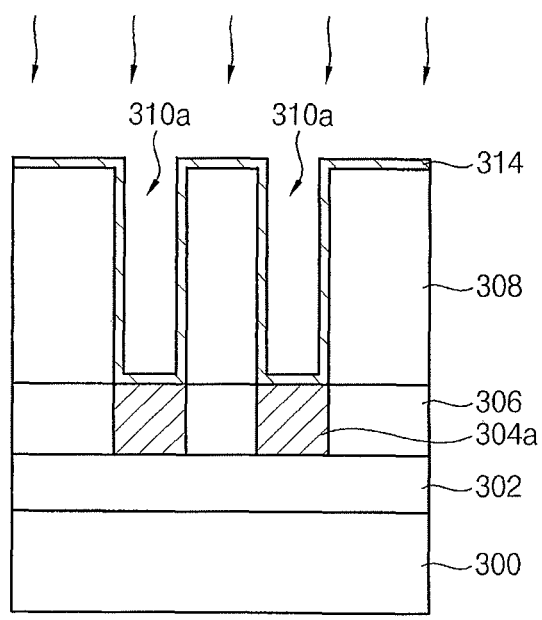
Figure 31:
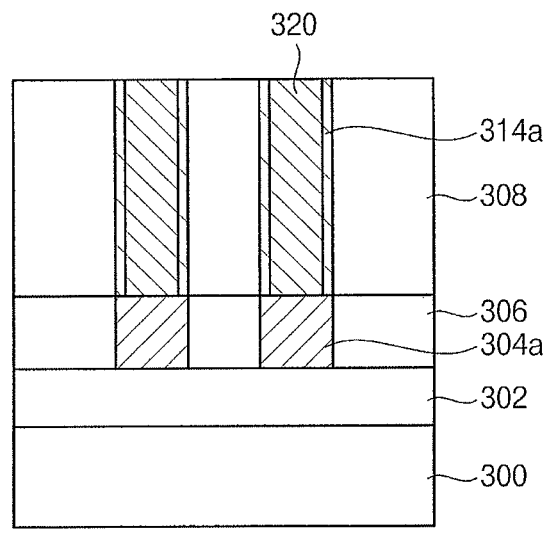

FIGS. 29 to 31 illustrate cross-sectional views of stages of a method of manufacturing a semiconductor device in accordance with example embodiments.

The semiconductor device may be formed by performing processes substantially the same as or similar to those illustrated with reference to FIGS. 20 to 25, except for forming pad patterns including a metal.

Referring to FIG. 29, a lower insulation layer 302, a pad pattern 304a, a first insulating interlayer 306, and a second insulating interlayer 308 may be formed on a substrate 300. The second insulating interlayer 308 may be etched to form an opening 310a exposing surfaces of the pad pattern 304a. In example embodiments, the pad pattern 304a may include a metal.

A preliminary buffer oxide layer 312 may be conformally formed on a sidewall of the opening 310a, surfaces of the pad pattern 304a exposed by the opening 310a, and a top surface of the second insulating interlayer 308.

The preliminary buffer oxide layer 312 may be formed by performing processes substantially the same as or similar to those illustrated with reference to FIGS. 7 and 8.

During forming the preliminary buffer oxide layer 312, a surface of the pad pattern 304a may be oxidized, and a metal oxide layer 330 may be formed between the pad pattern 304a and the preliminary buffer oxide layer 312.

Referring to FIG. 30, the metal oxide layer 330 may be deoxidized to be removed. The preliminary buffer oxide layer 312 may be transformed into a buffer oxide layer 314 having a density higher than a density of the preliminary buffer oxide layer 312.

For example, a plasma treatment may be performed on the preliminary buffer oxide layer 312. The plasma treatment may be substantially the same as or similar to those illustrated with reference to FIGS. 9 and 10.

Referring to FIG. 31, the buffer oxide layer 314 may be anisotropically etched to form a buffer oxide pattern 314a on a sidewall of the opening 310a. A wet cleaning process may be performed on the buffer oxide pattern 314a using a cleaning solution.

In example embodiments, a remaining preliminary buffer oxide layer 312 after the etching process may be removed by the wet cleaning process.

A conductive layer may be formed on the buffer oxide pattern 314a, the pad pattern 304a, and the second insulating interlayer 308 to fill the opening 310a, and may be planarized until the top surface of the second insulating interlayer 308 may be exposed to form a contact plug 320. The contact plug 320 may include a metal.

A metal oxide layer may not be formed between the pad pattern 304a and the contact plug 320, and a contact resistance between the pad pattern 304a and the contact plug 320 may decrease.

The above semiconductor device may be applied to various types of systems, e.g., computing system.

Figure 32:
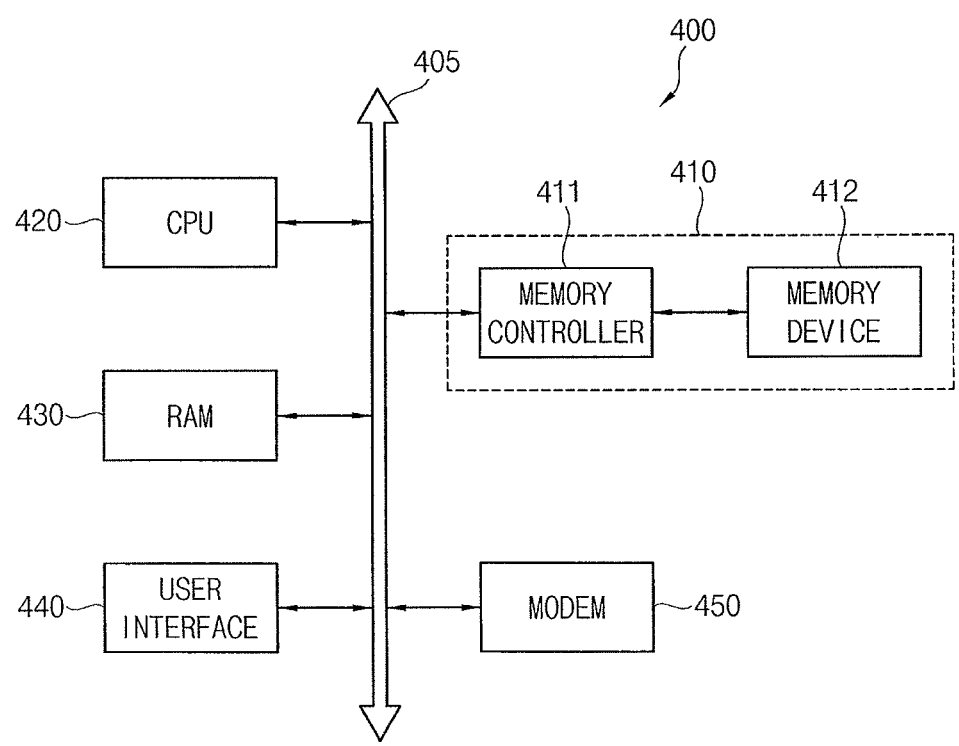
FIG. 32 illustrates a block diagram of a schematic construction of a system in accordance with example embodiments.

FIG. 32 illustrates a block diagram of a system in accordance with example embodiments.

Referring to FIG. 32, a data processing system 400 may include a central processing unit (CPU) 420 connecting to a system bus, random access memory (RAM) 430, a user interface 440, a modem 450 such as a baseband chipset, and a memory system 410. The memory system 410 may include a memory device 411 and a memory controller 412. The memory device 411 may include a semiconductor device in accordance with example embodiments. The memory device 411 may stably store data processed by the CPU 420 and/or inputting data. The memory controller 411 may control the memory device 412. The memory device 412 and the memory controller 411 may be coupled with each other, and the memory system 410 may serve, e.g., a memory card or a solid state disk (SSD). The data processing system 400 may be a mobile device, and the system 400 may further include a battery for supplying voltage. In example embodiments, the data processing system 400 may further include, e.g., an application chipset, a camera image processor, or mobile dynamic random-access memory (DRAM).

By way of summation and review, in a manufacturing a vertical memory device, a mold structure may be formed on a cell region of a substrate. The mold structure may include insulating interlayers and sacrificial layers alternatively stacked. A channel structure may be formed through the mold structure, and the mold structure may be etched to form an opening. The mold structure may be divided into a plurality of mold structures by the opening. The exposed sacrificial layers may be removed to form gaps, and gate lines including a metal may be formed to fill the gaps, respectively. An oxide layer may be formed on sidewalls of the gate lines. A metal oxide may be formed between each of the gate lines and the oxide layer, a density of the oxide layer may be lowered by the metal oxide, the metal in each of the gate lines may be diffused through the metal oxide layer and the oxide layer, metal contamination may increase, and resistances of the gate lines may increase.

According to example embodiments, after forming the oxide layer on the sidewalls of the gate lines, a plasma treatment may be performed on the oxide layer. The plasma treatment may be performed using an inert gas or a mixture of an inert gas and hydrogen gas. When the plasma treatment is performed, the metal oxide layer may be reduced to metal and a density of the oxide layer may increase, an outgassing of the metal in, e.g., from, each of the gate lines may decrease, metal contamination may decrease, resistances of the gate lines may decrease, and a vertical memory device having good performance may be manufactured.

Example embodiments relate to a semiconductor device having a conductive structure. Example embodiments provide a method of manufacturing a semiconductor device having reduced defects due to, for example, a conductive structure therein.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method of manufacturing a semiconductor device, the method comprising:
forming a structure on a substrate, the structure including a metal pattern, at least a portion of the metal pattern being exposed;
forming a preliminary buffer oxide layer to cover the structure, a metal oxide layer being formed at the exposed portion of the metal pattern; and
deoxidizing the metal oxide layer to convert the metal oxide layer into a metal of the metal pattern by moving oxygen from the metal oxide layer to the preliminary buffer oxide layer such that the preliminary buffer oxide layer is transformed into a buffer oxide layer.

2. The method as claimed in claim 1, wherein deoxidizing the metal oxide includes performing a plasma treatment on the structure.

3. The method as claimed in claim 2, wherein the plasma treatment is performed using an inert gas or a mixture of an inert gas and hydrogen gas.

4. The method as claimed in claim 2, wherein the plasma treatment is performed at a temperature of about 300° C. to about 600° C.

5. The method as claimed in claim 1, further comprising, after deoxidizing the metal oxide layer:
anisotropically etching the buffer oxide layer to form a buffer oxide pattern covering at least the metal pattern.

6. The method as claimed in claim 5, further comprising, after forming the buffer oxide pattern:
wet cleaning a surface of the buffer oxide pattern.

7. The method as claimed in claim 5, further comprising, after forming the buffer oxide pattern:
performing a plasma treatment on the buffer oxide pattern.

8. The method as claimed in claim 1, wherein forming the structure includes:
alternately and repeatedly forming insulating interlayers and sacrificial layers on the substrate;
forming a plurality of channel structures through the insulating interlayers and sacrificial layers;
etching the insulating interlayers and sacrificial layers between the channel structures to form an opening exposing an upper surface of the substrate; and
replacing the sacrificial layers exposed by the opening with a metal pattern.

9. The method as claimed in claim 8, wherein the preliminary buffer oxide layer is conformally formed on a surface of the structure and the exposed upper surface of the substrate.

10. The method as claimed in claim 8, further comprising, after forming the buffer oxide layer:
forming a common source line to fill the opening.

11. The method as claimed in claim 1, wherein the structure includes a tunnel insulation pattern, a charge storage pattern, a dielectric pattern, and the metal pattern sequentially stacked, the metal pattern serving as a control gate.

12. The method as claimed in claim 1, wherein forming the structure includes:
forming metal patterns and a first insulating interlayer on the substrate, the first insulating interlayer filling a gap between the metal patterns; and
forming a second insulating interlayer on the first insulating interlayer, the second insulating interlayer including openings therethrough, an upper portion of each of the metal patterns being exposed by each of the openings.

13. A method of manufacturing a semiconductor device, the method comprising:
alternately and repeatedly forming insulating interlayers and sacrificial layers on a substrate;
forming a plurality of channel structures through the insulating interlayers and sacrificial layers;
etching the insulating interlayers and sacrificial layers between the channel structures to form an opening exposing an upper surface of the substrate;
replacing the sacrificial layers exposed by the opening with gate lines, respectively, to form a structure, each of the gate lines including a metal;
forming a preliminary buffer oxide layer on a sidewall and a top surface of the structure and the upper surface of the substrate exposed by the opening;
performing a plasma treatment on the preliminary buffer oxide layer to form a buffer oxide layer; and
partially etching the buffer oxide layer to form a buffer oxide pattern covering a least each of the gate lines.

14. The method as claimed in claim 13, wherein the plasma treatment is performed using an inert gas or a mixture of an inert gas and hydrogen gas.

15. The method as claimed in claim 13, further comprising, after forming the buffer oxide pattern:
wet cleaning a surface of the buffer oxide pattern.

16. The method as claimed in claim 13, wherein the buffer oxide layer is anisotropically etched.

17. A method of manufacturing a semiconductor device, the method comprising:
forming a plurality of pad patterns and a first insulating interlayer filling a gap between the pad patterns on a substrate;
forming a second insulating interlayer on the first insulating interlayer, the second insulating interlayer including an opening exposing a portion of a surface of the pad pattern;
forming a preliminary buffer oxide layer on a top surface of the second insulating interlayer, a sidewall of the opening, and the surface of the pad pattern exposed by the opening;
performing a plasma treatment on the preliminary buffer oxide layer to transform a portion of the preliminary buffer oxide layer into a buffer oxide layer;
etching the buffer oxide layer to form a buffer oxide pattern exposing the pad pattern; and
wet cleaning the buffer oxide pattern to remove the preliminary buffer oxide,
wherein:
the plasma treatment is performed so that a first portion of the preliminary buffer oxide layer is transformed into a buffer oxide layer and a second portion of the preliminary buffer oxide layer remains,
the first portion of the preliminary buffer oxide layer is higher than a top surface of the pad pattern, and
the second portion of the preliminary buffer oxide layer is lower than a top surface of the pad pattern.

18. The method as claimed in claim 17, wherein the plasma treatment is performed using an inert gas or a mixture of an inert gas and hydrogen gas.

19. The method as claimed in claim 17, wherein:
the buffer oxide layer is anisotropically etched, and
the buffer oxide pattern is formed on a sidewall of the opening.

20. The method as claimed in claim 1, wherein deoxidizing the metal oxide to convert the metal oxide layer into a metal of the metal pattern by moving oxygen from the metal oxide layer to the preliminary buffer oxide layer such that the preliminary buffer oxide layer is transformed into a buffer oxide layer includes:

increasing a density of the preliminary buffer oxide layer, and lowering a resistance of the metal pattern.

* * * * *